(12) United States Patent
Hamam et al.

(10) Patent No.: US 9,057,830 B2
(45) Date of Patent: Jun. 16, 2015

(54) DISCRIMINATING ELECTROMAGNETIC RADIATION BASED ON ANGLE OF INCIDENCE

(75) Inventors: Rafif E. Hamam, Toronto (CA); Peter Bermel, Cambridge, MA (US); Ivan Celanovic, Cambridge, MA (US); Marin Soljacic, Belmont, MA (US); Adrian Y. X. Yeng, Cambridge, MA (US); Michael Ghebrebrhan, Cambridge, MA (US); John D. Joannopoulos, Belmont, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 554 days.

(21) Appl. No.: 13/186,159

(22) Filed: Jul. 19, 2011

(65) Prior Publication Data

US 2012/0037217 A1 Feb. 16, 2012

Related U.S. Application Data

(60) Provisional application No. 61/365,732, filed on Jul. 19, 2010.

(51) Int. Cl.
*G02B 27/42* (2006.01)
*H01L 31/0232* (2014.01)
(Continued)

(52) U.S. Cl.
CPC .............. *G02B 6/1225* (2013.01); *B82Y 20/00* (2013.01); *H01L 31/02168* (2013.01); *Y02E 10/50* (2013.01); *H02S 10/30* (2014.12)

(58) Field of Classification Search
CPC ............ G02B 6/1225; H01L 31/02167; H01L 31/02168
See application file for complete search history.

(56) References Cited

U.S. PATENT DOCUMENTS

| | | |
|---|---|---|
| 4,806,496 A | 2/1989 | Suzuki et al. |
| 5,601,661 A | 2/1997 | Milstein et al. |

(Continued)

FOREIGN PATENT DOCUMENTS

| | | |
|---|---|---|
| WO | WO 2009/036154 A1 | 3/2009 |
| WO | WO 2011/146843 A2 | 11/2011 |
| WO | WO 2012/012450 A1 | 1/2012 |

OTHER PUBLICATIONS

Optical constants of Tungsten (W); refractiveindex.info; <http://refractiveindex.info/?group=METALS&material=Tungsten>; date accessed Aug. 29, 2013.*

(Continued)

*Primary Examiner* — Jeffrey T Barton
*Assistant Examiner* — Edward Schmiedel
(74) *Attorney, Agent, or Firm* — Wolf, Greenfield & Sacks, P.C.

(57) ABSTRACT

The present invention provides systems, articles, and methods for discriminating electromagnetic radiation based upon the angle of incidence of the electromagnetic radiation. In some cases, the materials and systems described herein can be capable of inhibiting reflection of electromagnetic radiation (e.g., the materials and systems can be capable of transmitting and/or absorbing electromagnetic radiation) within a given range of angles of incidence at a first incident surface, while substantially reflecting electromagnetic radiation outside the range of angles of incidence at a second incident surface (which can be the same as or different from the first incident surface). A photonic material comprising a plurality of periodically occurring separate domains can be used, in some cases, to selectively transmit and/or selectively absorb one portion of incoming electromagnetic radiation while reflecting another portion of incoming electromagnetic radiation, based upon the angle of incidence. In some embodiments, one domain of the photonic material can include an isotropic dielectric function, while another domain of the photonic material can include an anisotropic dielectric function. In some instances, one domain of the photonic material can include an isotropic magnetic permeability, while another domain of the photonic material can include an anisotropic magnetic permeability. In some embodiments, non-photonic materials (e.g., materials with relatively large scale features) can be used to selectively absorb incoming electromagnetic radiation based on angle of incidence.

20 Claims, 20 Drawing Sheets

(51) Int. Cl.
  *G02B 6/122* (2006.01)
  *B82Y 20/00* (2011.01)
  *H01L 31/0216* (2014.01)
  *H02S 10/30* (2014.01)

(56) References Cited

U.S. PATENT DOCUMENTS

| | | | |
|---|---|---|---|
| 5,942,047 A | 8/1999 | Fraas et al. | |
| 5,955,749 A | 9/1999 | Joannopoulos et al. | |
| 6,130,780 A | 10/2000 | Joannopoulos et al. | |
| 6,583,350 B1 | 6/2003 | Gee et al. | |
| 6,611,085 B1* | 8/2003 | Gee et al. | 313/271 |
| 6,613,972 B2 | 9/2003 | Cohen et al. | |
| 6,932,951 B1 | 8/2005 | Losey et al. | |
| 6,939,632 B2 | 9/2005 | Arana et al. | |
| 7,267,779 B2 | 9/2007 | Arana et al. | |
| 2003/0027022 A1 | 2/2003 | Arana et al. | |
| 2004/0035457 A1 | 2/2004 | Kribus | |
| 2005/0109387 A1 | 5/2005 | Marshall | |
| 2005/0121069 A1 | 6/2005 | Chou et al. | |
| 2005/0126624 A1 | 6/2005 | Pellizzari | |
| 2005/0174760 A1* | 8/2005 | Perlo et al. | 362/159 |
| 2006/0283584 A1 | 12/2006 | Arana et al. | |
| 2008/0116779 A1 | 5/2008 | Janson | |
| 2009/0188547 A1 | 7/2009 | Hayashi et al. | |
| 2009/0217977 A1* | 9/2009 | Florescu et al. | 136/256 |
| 2011/0284059 A1 | 11/2011 | Celanovic et al. | |
| 2012/0312371 A1 | 12/2012 | Rinzler et al. | |

OTHER PUBLICATIONS

Optical constants of Air; refractiveindex.info; <http://refractiveindex.info/?group=GASES&material=Air>; date accessed Aug. 29, 2013.*
Liang, Zhijian et al.; Metallodielectric Opals of Layer-by-Layer Processed Coated Colloids; Adv. Mater. 14, No. 16; Aug. 2002; pp. 1160-1164.*
Ye, Zhuo et al.; Design for 2D anisotropic photonic crystal with large absolute band gapbs by using a genetic algorithm; Eur. Phys. J. 37, Apr. 9, 2004; pp. 417-419.*
Lee, Hyun-Yong et al.; TiO2(ZnS)/SiO2 One-Dimensional Photonic Crystals and a Proposal for Vertical Micro-Cavity Resonators; Journal of the Korean Physical Society, vol. 44, No. 2; Feb. 2, 2004; pp. 387-392.*
Rill, Michael S. et al.; Photonic metamaterials by direct laser writing and silver chemical vapour deposition; Nature Materials; May 11, 2008; pp. 543-546.*
Rill, Michael S. et al.; Negative-index bianisotropic photonic metamaterial fabricated by direct laser writing and silver shadow evaporation; Optical Letters, Optical Society of America; Dec. 22, 2008; pp. 19-21.*
The Engineering Toolbox—Relative Permittivity—Dielectric Constant; http://www.engineeringtoolbox.com/relative-permittivity-d_1660.html; accessed Apr. 20, 2014.*
Titanium dioxide-titania (TiO2); http://www.azom.com/article.aspx?ArticleID=1179; accessed Apr. 20, 2014.*
Optical constants of SiO2; http://refractiveindex.info/legacy/?group=CRYSTALS&material=SiO2; accessed Apr. 20, 2014.*
Arriaga, J. et al.; Band structure and reflectivity of omnidirectional Si-based mirrors with a Gaussian profile refractive index; Journal of Applied Physics; 100; published Aug. 29, 2006; pp. 0044911-1-0044911-4; http://scitation.aip.org/content/aip/journal/jap/100/4/10.1063/1.2336078.*
Chemical Book; Trisodium hexafluoroaluminate; accessed Oct. 16, 2014; http://www.chemicalbook.com/ChemicalProductProperty_EN_CB8300371.htm.*
Chemical Dictionary Online; Sodium hexafluoroaluminate; accessed Oct. 16, 2014; http://www.chemicaldictionary.org/dic/S/Sodium-hexafluoroaluminate_690.html.*

Chigrin, D.N. et al.; Observation of total omnidirectional reflection from a one-dimensional dielectric lattice; Applied Physics A; published 1999; pp. 25-28; http://link.springer.com/article/10.1007%2Fs003390050849.*
Linden, S. et al.; Model System for a One-Dimensional Magnetic Photonic Crystal; Physical Review Letters; published Aug. 25, 2006; pp. 083902-1-083902-4; http://journals.aps.org/prl/abstract/10.1103/PhysRevLett.97.083902.*
Merriam-Webster; definition of Layer; printed Oct. 16, 2014; http://www.merriam-webster.com/dictionary/layer.*
Semiconductor Materials; accessed Oct. 16, 2014; http://www.semi1source.com/materials/default.asp?SearchTerm=Zn.*
Invitation to Pay Additional Fees, mailed Oct. 31, 2011, in Related International Application No. PCT/US2011/044562.
International Search Report and the Written Opinion, mailed Dec. 28, 2011, in Related International Application No. PCT/US2011/044562.
International Preliminary Report on Patentability, issued Jan. 31, 2013, in Related International Application No. PCT/US2011/044562.
Angell et al., "Silicon Micromechanical Devices," *Scientific American*, vol. 248, No. 4, Apr. 1983, 44-55.
Araghchini et al., "Fabrication of two-dimensional tungsten photonic crystals for high-temperature applications," *J. Vac. Sci Technol.*, B 29(6), Nov./Dec. 2011, 061402(1)-(4).
Barwicz et al., "Polarization-transparent microphotonic devices in the strong confinement limit," *Nature Photonics*, vol. 1, Jan. 2007, 57-60.
Bermel et al. "Design and global optimization of high-efficiency thermophotovoltaic systems," TPV-9 Conference 2010, 1-6.
Bermel et al., "Design and global optimization of high-efficiency thermophotovoltaic systems," *Optics Express*, vol. 18, No. 103, published Aug. 2, 2010, A314-A334.
Bermel et al., "Tailoring photonic metamaterial resonances for thermal radiation," *Nanoscale Research Letters*, 2011, 6:549, 1-5.
Bienstman, "Rigorous and efficient modelling of wavelength scale photonic components," PhD Thesis, 2001.
Blackwell, "Design, Fabrication, and Characterization of a Micro Fuel Processor," PhD Thesis, Massachusetts Insittute of Technology, Mar. 6, 2008.
Celanovic et al, "Resonant-cavity enhanced thermal emission," *Physical Review*, B 72, 2005, 075127(1)-(6).
Celanovic et al., "Design and optimization of one-dimensional photonic crystals for thermophotovoltaic applications," *Optics Letters*, vol. 29, No. 8, Apr. 15, 2004, 863-865.
Celanovic et al., "Two-dimensional tungsten photonic crystals as selective thermal emitters," *Applied Physics Letters*, 92, 2008, 193101(1)-(3).
Chan et al., "A high efficiency millimeter-scale thermophotovoltaic generator," TPV-9 Conference 2010, 1-4.
Chester et al., "Design and global optimization of high-efficiency solar thermal systems with tungsten cermets," *Optics Express*, vol. 19, No. S3, Published Mar. 29, 2011, A245-A257.
Fahr et al., "Rugate filter for light-trapping in solar cells," *Optics Express*, Published Jun. 10, 2008, vol. 16, No. 13, 9332-9343.
Farjadpour et al., "Improving accuracy by subpixel smoothing in the finite-difference time domain," *Optics Letters*, vol. 31, No. 20, Oct. 15, 2006, 2972-2974.
Fleming et al., "All-metallic three-dimensional photonic crystals with a large infrared bandgap," *Nature*, vol. 417, May 2, 2002, 52-55.
Florescu et al., "Improving solar cell efficiency using photonic band-gap materials," *Solar Energy Materials & Solar Cells* 91 (2007), 1599-1610.
Franco-Ferreira et al., "Long Life Radioisotopic Power Sources Encapsulated in Platinum Metal Alloys," *Platinum Metals Rev.*, 1997, 41, (4), 154-163.
Gablonsky, et al., "A Locally-Biased form of the DIRECT Algorithm," *Journal of Global Optimization*, 21(1), 27-37 (2001).
Ghebrebrhan et al., "Tailoring thermal emission via Q matching of photonic crystal resonances," *Physical Review*, A 83, 2011,033810(1)-(6).

(56) References Cited

OTHER PUBLICATIONS

Green, "Limiting photovoltaic monochromatic light conversion efficiency," *Progress in photovoltaics: Research and Applications*, vol. 9, 257-261 (2001).
Henry, "Limiting efficiencies of ideal single and multiple energy gap terrestrial solar cells," *J. Appl. Phys.* 51, 4494-4500 (1980).
Herzinger et al., "Ellipsometric determination of optical constants for silicon and thermally grown silicon dioxide via a multi-sample, multi-wavelength, multi-angle investigation," *Journal of Applied Physics*, vol. 83, No. 6, Mar. 15, 1998, 3323-3336.
Koudelka, et al., "Radioisotope Micropower System Using Thermophotovoltaic Energy Conversion," *Space Technology and Applications International Forum—STAIF* 2006, Feb. 12-16, 2006.
Kucherenko, et al., "Application of Deterministic Low-Discrepancy Sequences in Global Optimization," *Computational Optimization and Applications*, 30, 297-318 (2005).
Li, "Large Absolute Band Gap in 2D, Physical Review Letters," Physical Review Letters, vol. 81, No. 12, Sep. 21, 1998, 2574-2577.
Linden, "Model System for a One-Dimensional Magnetic Photonic Crystal," *Physical Review Letters*, 2006, 083902(1)-(4).
Mao et al., "New development of one-dimensional $Si/SiO_2$ photonic crystals filter for thermophotovoltaic applications," *Renewable Energy*, 35, 2010, 249-256.
Marton, "Catalytic Combustion for Direct Thermal-to-Electrical Energy Conversion," Presented at an Interview on Oct. 29, 2009.
Mutitu et al., "Angular Selective Light Filter Based on Photonic Crystals for Photovoltaic Applications," *IEEE Photonic Journal*, vol. 2, No. 3, Jun. 2010, 489-499.
Oskooi et al., "MEEP: A flexible free-software package for electromagnetic simulations by the FDTD method," *Computer Physics Communications*, 181 (2010), 687-702.
O'Sullivan et al., "Optical characteristics of one-dimensional $Si/SiO_2$ photonic crystals for thermophotovoltaic applications," *Journal of Applied Physics*, 97, 2005, 033529(1)-(7).
Pendry et al., "Magnetism from Conductors and Enhanced Nonlinear Phenomena," *IEEE Transactions on Microwave Theory and Techniques*, vol. 47, No. 11, Nov. 1999, 2075-2084.
Pilawa-Podgurski et al., "Low-Power Maximum Power Point Tracker with Digital Control for Thermophotovoltaic Generators," *Twenty Fifth Annual IEEE*, Feb. 21-25, 2010, 961-967.
Pilawa-Podgurski, et al, "Integrated CMOS DC-DC Converter with Digital Maximum Power Point Tracking for a Portable Thermophotovoltaic Power Generator," Energy Conversion Congress and Exposition (ECCE), 2011 IEEE, Sep. 17-22, 2011.
Rephaeli et al., "Absorber and emitter for solar thermo-photovoltaic systems to achieve efficiency exceeding the Shockley-Queisser limit," *Optics Express*, vol. 17, No. 17, Published Aug. 11, 2009, 15145-15159.
Sai et al., "Thermophotovoltaic generation with selective radiators based on tungsten surface gratings," *Applied Physics Letters*, vol. 85, No. 16, Oct. 18, 2004.
Ulbrich, et al., "Directional selectivity and light-trapping in solar cells," *Photonics for Solar Energy Systems II*, vol. 7002, 70020A, Apr. 7, 2008.
Whittaker et al., "Scattering-matrix treatment of patterned multilayer photonic structures," *Physical Review B*, vol. 60, No. 4, Jul. 15, 1999, 2610-2618.
Wilkinson, "Photonic Bloch oscillations and Wannier-Stark ladders in exponentially chirped Bragg gratings." *Phys Rev E Stat Nonlin Soft Matter Phys.* May 2002;65(5 Pt 2):056616.
Yeng et al., "Enabling High Temperature Nanophotonics for Energy Applications," *PNAS*, vol. 109, No. 7, Feb. 14, 2012, 2280-2285.
Liu et al., Air waveguide in a hybrid 1D and 2D photonic crystal hetero-structure. Optics Communications. Aug. 2009;282:4445-8.
Lorenzo et al., Porous silicon-based rugate filters. Appl Opt. Sep. 10, 2005;44(26):5415-21.
Song et al. Graded refractive index SiOx infrared filters prepared by reactive magetron sputtering. American Vacuum Society. Feb. 6, 2008; 265-269.

\* cited by examiner

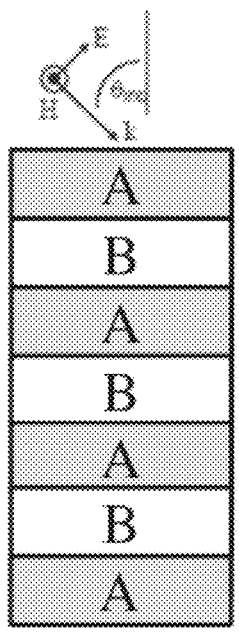 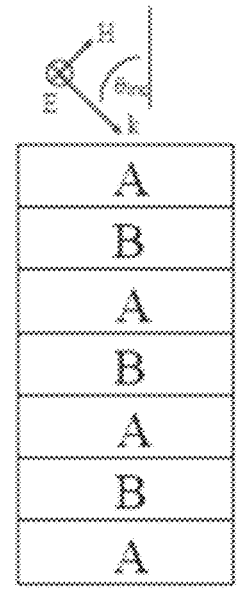
FIG. 6C   FIG. 6D
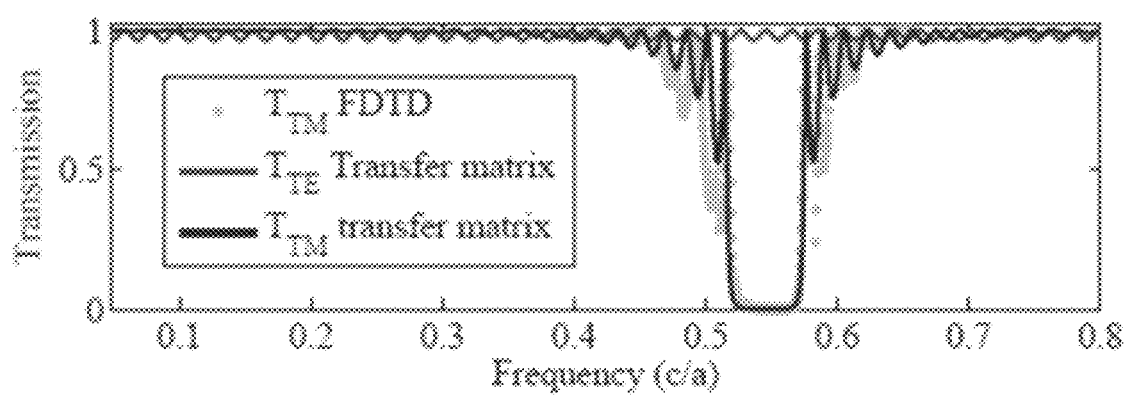
FIG. 6E

DISCRIMINATING ELECTROMAGNETIC RADIATION BASED ON ANGLE OF INCIDENCE

RELATED APPLICATIONS

This application claims priority under 35 U.S.C. §119(e) to U.S. Provisional Patent Application Ser. No. 61/365,732, filed Jul. 19, 2010, and entitled "Discriminating Electromagnetic Radiation Based on Angle of Incidence," which is incorporated herein by reference in its entirety for all purposes.

GOVERNMENT SPONSORSHIP

This invention was made with government support under Contract No. W911NF-07-D-0004 awarded by the Army Research Office, Contract No. DE-SC0001299 awarded by the Department of Energy, and Contract No. DMR0819762 awarded by the National Science Foundation. The government has certain rights in this invention.

FIELD OF INVENTION

Articles, systems, and methods for discriminating electromagnetic radiation based on angle of incidence are generally described.

BACKGROUND

Materials and structures that discriminate electromagnetic radiation based on one or more of its properties (e.g. polarization, frequency) can be useful in a wide range of systems. For example, polarizers can discriminate (e.g., transmit and/or absorb vs. reflect) electromagnetic radiation based on its polarization, irrespective of the angle of incidence, over a wide range of frequencies. Photonic crystals (PhCs) can reflect electromagnetic radiation of certain frequencies irrespective of the angle of incidence and irrespective of the polarization. A material system that could transmit and/or absorb electromagnetic radiation based on the angle of incidence could have a wide range of uses.

SUMMARY OF THE INVENTION

Discriminating electromagnetic radiation based on the angle of incidence, and associated articles, systems, and methods, are generally described. The subject matter of the present invention involves, in some cases, interrelated products, alternative solutions to a particular problem, and/or a plurality of different uses of one or more systems and/or articles.

In one aspect, a photonic material is described. In some embodiments, the photonic material comprises a periodic assembly of domains having different dielectric properties, the periodic assembly of domains comprising a material having a first index of refraction and configured to be exposed to electromagnetic radiation from a medium having a second index of refraction that is smaller than the first index of refraction. In some embodiments, at least about 75% of a first portion of the electromagnetic radiation that contacts a first incident surface of the photonic material at an angle of incidence within a range of angles of incidence spanning about 45° or less is not reflected by the photonic material, and at least about 75% of a second portion of the electromagnetic radiation that contacts a second incident surface of the photonic material at an angle of incidence outside the range is reflected by the photonic material.

In one aspect, a system is provided. The system comprises, in some embodiments, an electromagnetic radiation discriminator configured to absorb and/or transmit electromagnetic radiation, the discriminator comprising a material with a first index of refraction and configured to be exposed to electromagnetic radiation from a medium having a second index of refraction that is smaller than the first index of refraction; an energy conversion device configured to produce electricity from electromagnetic radiation and/or heat received from the electromagnetic radiation discriminator, wherein at least about 75% of a first portion of the electromagnetic radiation that contacts a first incident surface of the electromagnetic radiation discriminator at an angle of incidence within a range of angles of incidence spanning about 45° or less is absorbed and/or transmitted through the radiation discriminator, and at least about 75% of a second portion of electromagnetic radiation that contacts a second incident surface of the electromagnetic radiation discriminator at an angle of incidence outside the range is reflected by the article.

In some embodiments, the system comprises a transmitter comprising a material with a first index of refraction configured to be exposed to electromagnetic radiation from a medium in contact with the transmitter having a second index of refraction that is smaller than the first index of refraction; and an absorber configured to absorb at least a portion of the electromagnetic radiation transmitted through the transmitter; wherein at least about 75% of a first portion of the electromagnetic radiation that is incident upon a first incident surface of the transmitter at an angle of incidence within a range of angles of incidence spanning about 45° or less is transmitted through the transmitter, and at least about 75% of a second portion of the electromagnetic radiation that is incident upon a second incident surface of the transmitter at an angle of incidence outside the range is reflected by the transmitter.

In one aspect, an article is described. In some embodiments, the article comprises a photonic material comprising a plurality of periodically occurring separate domains, including at least a first domain and a second domain adjacent the first domain, wherein the first or second domain has an isotropic dielectric function while the other of the first and second domains has an anisotropic dielectric function; and the first or second domain has an isotropic magnetic permeability while the other of the first and second domains has an anisotropic magnetic permeability.

In some embodiments, the article comprises a photonic material comprising a plurality of periodically occurring separate domains, including at least a first domain and a second domain adjacent the first domain, wherein the first or second domain has an isotropic dielectric function while the other of the first and second domains has an anisotropic dielectric function; and a polarizer configured to produce TM-polarized electromagnetic radiation from the incoming electromagnetic radiation such that the TM-polarized electromagnetic radiation is incident on the photonic material.

Other advantages and novel features of the present invention will become apparent from the following detailed description of various non-limiting ornbodiments of the invention when considered in conjunction with the accompanying figures. In cases where the present specification and a document incorporated by reference include conflicting and/or inconsistent disclosure, the present specification shall control.

BRIEF DESCRIPTION OF THE DRAWINGS

Non-limiting embodiments of the present invention will be described by way of example with reference to the accompanying figures, which are schematic and are not intended to be drawn to scale. In the figures, each identical or nearly identical component illustrated is typically represented by a single numeral. For purposes of clarity, not every component is labeled in every figure, nor is every component of each embodiment of the invention shown where illustration is not necessary to allow those of ordinary skill in the art to understand the invention. In the figures:

FIGS. 6A-6E are, according to some embodiments, (A, C, and D) schematic diagrams illustrating exemplary 1-dimensionally periodic photonic crystals and (B and E) exemplary plots of transmission as a function of frequency;

DETAILED DESCRIPTION

Figure 1A:
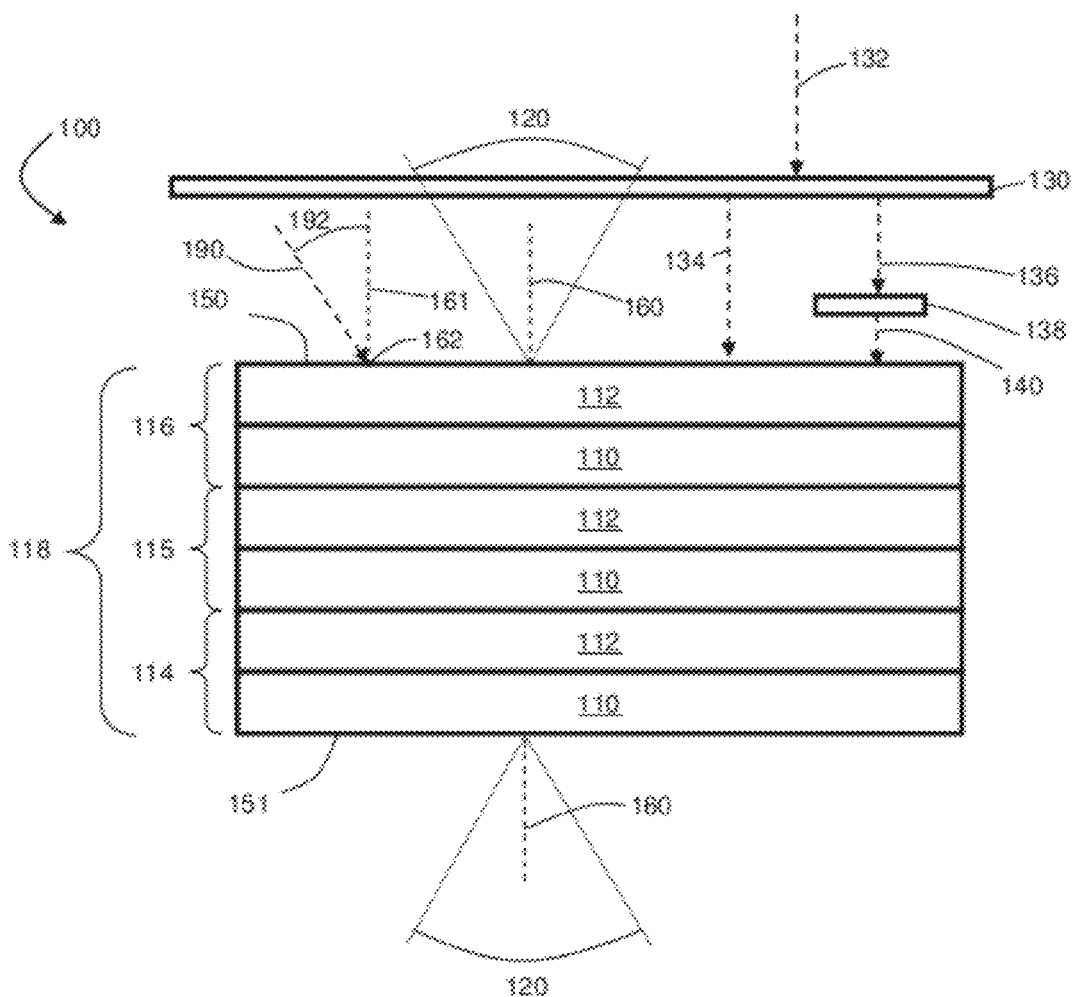
FIGS. 1A-1B are exemplary schematic illustrations of articles that can be used to discriminate electromagnetic radiation based on angle of incidence, according to some embodiments.

The present invention provides systems, articles, and methods for discriminating electromagnetic radiation based upon the angle of incidence of the electromagnetic radiation. In some cases, the materials and systems described herein can be capable of inhibiting reflection of electromagnetic radiation (e.g., the materials and systems can be capable of transmitting and/or absorbing electromagnetic radiation) within a given range of angles of incidence at a first incident surface, while substantially reflecting electromagnetic radiation outside the range of angles of incidence at a second incident surface (which can be the same as or different from the first incident surface). A photonic material comprising a plurality of periodically occurring separate domains can be used, in some cases, to selectively transmit and/or selectively absorb one portion of incoming electromagnetic radiation while reflecting another portion of incoming electromagnetic radiation, based upon the angle of incidence. In some embodiments, one domain of the photonic material can include an isotropic dielectric function, while another domain of the photonic material can include an anisotropic dielectric function. In some instances, one domain of the photonic material can include an isotropic magnetic permeability, while another domain of the photonic material can include an anisotropic magnetic permeability. In some embodiments, non-photonic materials (e.g., materials with relatively large scale features) can be used to selectively absorb incoming electromagnetic radiation based on angle of incidence.

In some applications, it would be beneficial if electromagnetic radiation incident at a particular angle (or a range of angles) would be inhibited from being reflected (e.g., it would be transmitted and/or absorbed), while other angles of incidence would be substantially reflected (e.g., nearly perfectly reflected), independent of the incoming polarization, and for as wide a range of frequencies as possible. Such materials could be useful in a wide variety of applications including, for example, solar energy applications, producing a highly enhanced green-house effect. As one specific, non-limiting example, such materials could be used to discriminate sunlight, which travels along a relatively well-defined direction and, accordingly, has a relatively well-defined angle of incidence. When sunlight interacts with components of solar-energy conversion devices (e.g., solar absorbers, selective emitters, photovoltaic (PV) cells, etc.), a portion of sunlight can be reflected from one or more components of the solar-energy conversion device, while another portion can be re-radiated (e.g., because of radiative recombination, or in solar-thermal systems because of thermal emission). Reflection and re-radiation result in energy losses, which can often be substantial and can lower the overall efficiency of the solar-energy conversion device. If one could place a material proximate an absorber, selective emitter, and/or a PV cell (e.g., a solar cell) that would substantially inhibit reflection of (e.g., substantially transmit and/or substantially absorb) electromagnetic radiation at a particular angle (e.g., the angle coming from the sun) or range of angles, while substantially reflecting electromagnetic radiation emerging from the solar-energy conversion device (most of which propagates at angles that are different from the angle at which the electromagnetic radiation approaches from the sun) back to the solar-energy conversion device, the efficiency of the energy-conversion system could be greatly improved.

In some embodiments, the devices and systems described herein make use of photonic materials. As used herein, the terms "photonic material" and "photonic crystal" are given their ordinary meaning in the art, and refer to a material that can control the propagation of electromagnetic radiation based on a periodic assembly of domains having different dielectric properties. In some embodiments, the photonic crystals include domains with one or more dimensions of the same order of magnitude as the wavelength(s) of the electromagnetic radiation the photonic crystal is configured to control the propagation of. "Photonic crystal" and "photonic material" are used interchangeably herein, and refer to the same class of materials.

The photonic materials described herein can have, in some cases, 1-dimensional and/or 2-dimensional periodicity. One of ordinary skill in the art would be able to determine the dimensionality of the periodicity of a photonic crystal upon inspection. For example, 1-dimensionally periodic photonic crystals include materials arranged in such a way that a line along a first coordinate direction within the photonic crystal passes through multiple domains while lines along second and third orthogonal coordinate directions, each of the second and third coordinate directions being orthogonal to the first coordinate direction within the photonic crystal, do not pass through multiple domains. In some embodiments, the index of refraction at least one point within the 1-dimensionally periodic photonic crystal varies along a first coordinate direction and does not substantially vary along second and third orthogonal coordinate directions, each of the second and third coordinate directions being orthogonal to the first coordinate direction. For example, a 1-dimensionally periodic photonic crystal can include two or more materials and/or metamaterials arranged in a stack such that a line along a first coordinate direction passes through multiple layers while lines along second and third coordinate directions (each orthogonal to the first coordinate direction) remain within a single layer. An example of a 1-dimensionally periodic photonic crystal is shown as photonic crystal 118 in FIG. 1A.

Figure 4A:
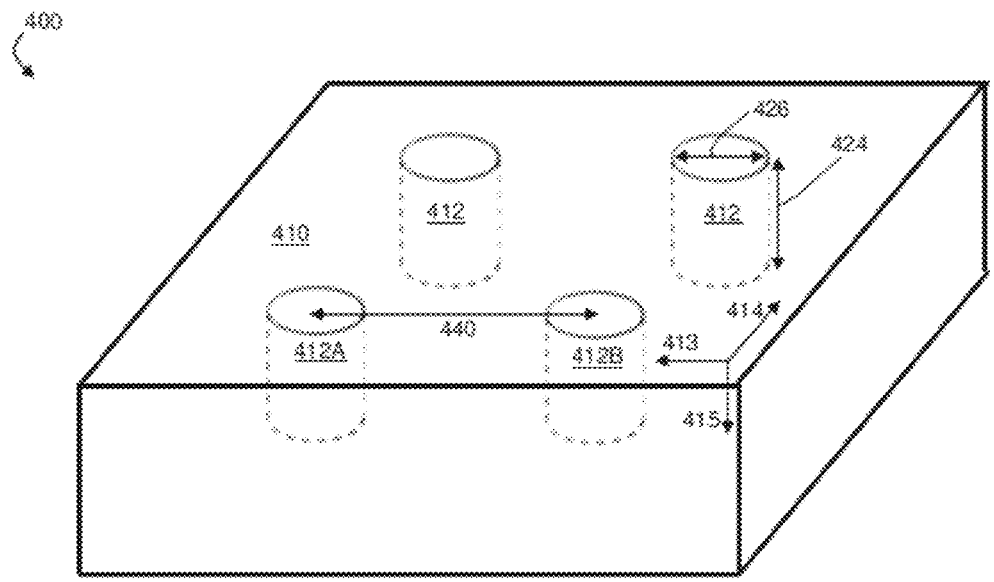
FIGS. 4A-4B are exemplary schematic diagrams of a selective absorber, according to some embodiments.
Figure 4B:
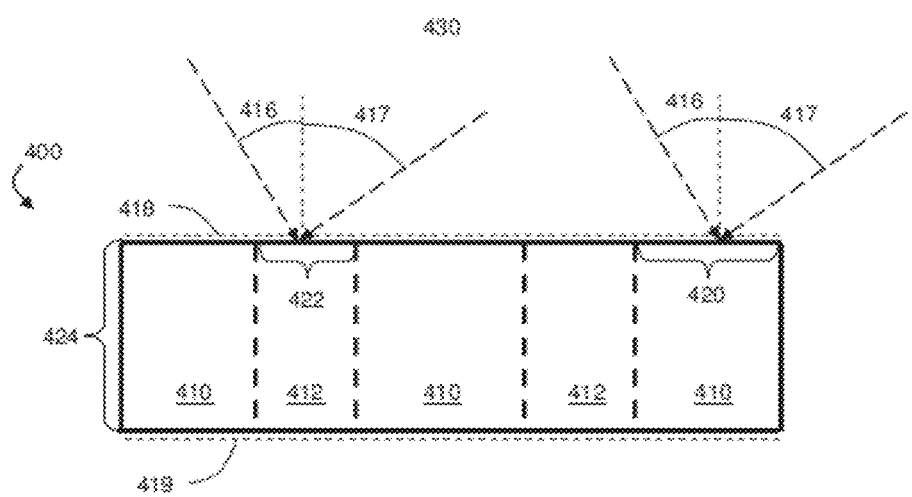

2-dimensionally periodic photonic crystals include materials arranged in such a way that lines along first and second orthogonal coordinate directions within the photonic crystal pass through multiple domains while a line along a third coordinate direction, orthogonal to the first and second coordinate directions, does not pass through multiple domains. In some embodiments, the index of refraction within the volume of a 2-dimensionally periodic photonic crystal varies along first and second orthogonal coordinate directions, but does not substantially vary along a third coordinate direction orthogonal to the first and second coordinate directions. For example, a 2-dimensionally periodic photonic crystal can include two or more materials arranged such that at least one material forms a series of elongated rods that extend through the thickness of another material. An example of a 2-dimensionally periodic photonic crystal is shown in FIGS. 4A-4B and on the left side of FIG. 6A.

As noted above, various aspects are related to distinguishing electromagnetic radiation based on angle of incidence. As used herein, the "angle of incidence" between electromagnetic radiation and a given article (e.g., an incident surface of the article) refers to the smallest angle formed between the vector along which electromagnetic radiation travels and the line extending perpendicularly from the incident surface from the point at which the electromagnetic radiation intersects the incident surface of the article. For example, in the set of embodiments illustrated in FIG. 1A, the angle of incidence 192 between incoming electromagnetic radiation 190 and incident surface 150 is measured relative to line 161 normal to incident surface 150 and originating from point 162, where electromagnetic radiation 190 intersects incident surface 150.

Figure 2:
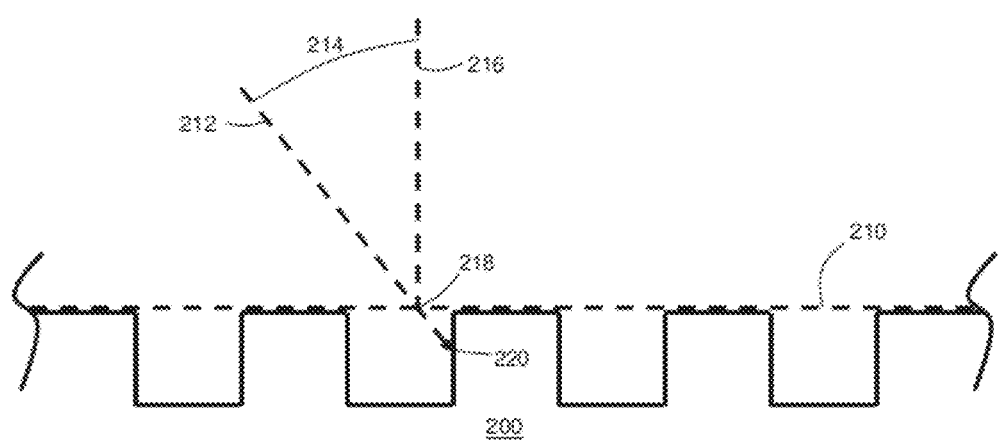
FIG. 2 is an exemplary schematic illustration showing an incident surface, according to some embodiments.

In this context, an "incident surface" of an article refers to the geometric surface of the article, which will be understood by those of ordinary skill in the art to refer to the surface defining the outer boundaries of the article on which electromagnetic radiation is incident, and does not include surfaces lying within the external boundaries of the article. For example, the incident surface would include the area that may be measured by a macroscopic measuring tool (e.g., a ruler), but would not include surfaces formed by pores or holes formed within the article. In some cases (e.g., when an article has a relatively smooth, non-porous exterior surface), the incident surface of an article corresponds to a physical surface of the article. For example, in the set of embodiments illustrated in FIG. 1A, incident surface 150 of photonic crystal 118 corresponds to the top surface of photonic crystal 118. In other embodiments (e.g., when the external surface of the object includes pores, holes, and/or other discontinuities passing through it), the incident surface is an imaginary surface that spans the outermost points of the object. For example, in the set of embodiments illustrated in FIG. 2, incident surface of article 200 corresponds to imaginary surface 210. In this set of embodiments, the angle of incidence between electromagnetic radiation 212 and article 200 corresponds to angle 214, even though electromagnetic radiation 212 does not contact article 200 until point 220. In FIG. 2, angle 214 is the smallest angle between the vector along which electromagnetic radiation 212 travels and a line 216 that is perpendicular to surface 210 and originates from the point 218 at which electromagnetic radiation 212 intersects surface 210.

In some embodiments, the articles described herein can be configured to inhibit reflection of electromagnetic radiation (e.g., transmit and/or absorb electromagnetic radiation) that contacts a first incident surface of the article at an angle of incidence within a range of angles. For example, in some embodiments, the article can be configured such that at least about 75%, at least about 85%, at least about 95%, at least about 99%, at least about 99.9%, or substantially all of the electromagnetic radiation that contacts the first incident surface at an angle of incidence within a range of angles of incidence spanning about 45° or less, about 30° or less, about 15° or less, about 5° or less, about 2° or less, or about 1° or less is not reflected by the article (e.g., is transmitted through the article and/or is absorbed by the article). A range of angles of incidence is said to span X° when the range includes all incidence angles from Y° to Z°, wherein the difference between Z and Y is X. For example, a range of angles of incidence spanning 30° could include all incidence angles between 0° and 30° (where, according to the description above, Y=0 and Z=30), all incidence angles between 15° and 45°, all incidence angles between 30° and 60°, etc. In some embodiments, the range of angles of incidence over which reflection of the electromagnetic radiation is inhibited includes the 0° angle normal to an incident surface. In some embodiments, and as described in more detail below, the range of angles of incidence over which reflection of electromagnetic radiation is inhibited does not include the 0° angle normal to the incident surface.

In some embodiments, the articles described herein can be configured to substantially reflect electromagnetic radiation that contacts a second incident surface of the article at an angle of incidence outside the range of angles over which reflection was inhibited. For example, in some embodiments, the article can be configured such that at least about 75%, at least about 85%, at least about 95%, at least about 99%, at least about 99.9%, or substantially all of the electromagnetic radiation that contacts the second incident surface outside the range of angles of incidence spanning about 45° or less, about 30° or less, about 15° or less, about 5° or less, about 2° or less, or about 1° or less is reflected by the article.

In some embodiments, the first incident surface and the second incident surface are the same. For example, in some articles described herein, the top surface of the article can be configured such that it inhibits reflection of electromagnetic radiation within a given range of angles of incidence and substantially reflects electromagnetic radiation outside that range of angles of incidence. In some embodiments, the first incident surface and the second incident surface are different. For example, in some embodiments (e.g., in some cases in which a selective transmitter is employed), the first incident surface is the top surface of the article (e.g., a surface exposed to incoming electromagnetic radiation from a source such as the sun), which can be configured to inhibit reflection of incoming electromagnetic radiation within a given range of angles of incidence. In some such embodiments, the second incident surface is the bottom surface of the article (e.g., a surface exposed to reflected and/or re-emitted radiation from a selective emitter, TPV cell, etc.) which can be configured to reflect incident electromagnetic radiation with an angle of incidence outside the given range of angles.

In some embodiments in which the first and second incident surfaces are different, the second incident surface can be substantially parallel to the first incident surface. In some embodiments, the first incident surface and the second incident surfaces face in opposite directions (e.g., incident surfaces 150 and 151 in FIG. 1A).

In some embodiments, at least some (and, in some cases, all) of the material within the articles used to discriminate electromagnetic radiation has an index of refraction that is greater than the index of refraction of a medium in contact with the article and through which electromagnetic radiation (e.g., discriminated electromagnetic radiation) passes to contact the article. For example, in many embodiments described herein, the electromagnetic radiation is transported through air (which has an index of refraction of about 1.0003) prior to contacting the article, and the article includes a material having an index of refraction greater than that of air (e.g., tungsten, which has an index of refraction of about 2). One of ordinary skill in the art would be capable of measuring the index of refraction of an article using an ellipsometer. The articles described herein can be configured to discriminate electromagnetic radiation over a relatively broad range of wavelengths, in some embodiments. For example, in some cases, the articles described herein can be configured to discriminate electromagnetic radiation (e.g., inhibit reflection of and/or substantially reflect electromagnetic radiation to any of the extents mentioned herein and/or within/outside any of the ranges of angles of incidence mentioned herein) based on the angle of incidence over a range of wavelengths of between about 100 nm and about 300 micrometers, between about 100 nm and about 100 micrometers, between about 100 nm and about 10 micrometers, or between about 100 nm and about 1 micrometer. In some embodiments, the articles described herein can be configured to discriminate visible electromagnetic radiation (e.g., between about 400 nm and about 760 nm), ultraviolet electromagnetic radiation (e.g., between about 100 nm and about 400 nm), and/or infrared electromagnetic radiation (e.g., between about 760 nm and about 300 micrometers). In some embodiments, the electromagnetic radiation includes a wavelength that interacts photonically with a photonic material in the article configured to discriminate electromagnetic radiation.

As noted above, in some embodiments, articles for discriminating electromagnetic radiation based upon the angle of incidence (i.e., electromagnetic radiation angular discriminators) are provided. In some embodiments, an article can discriminate electromagnetic radiation such that a relatively large percentage of incident radiation within a range of angles of incidence is transmitted through the article and a relatively large percentage of the incident radiation outside the range of angles of incidence is reflected by the article. FIG. 1A includes an exemplary schematic illustration of article 100, which can be used to substantially reflect or substantially transmit electromagnetic radiation based upon the angle of incidence, according to some embodiments. In FIG. 1A, article 100 includes a plurality of periodically occurring separate domains, including first domain regions 110 and second domain regions 112. The first and second domain regions can be adjacent each other. For example, in some embodiments, one or more materials (e.g., an adhesion promoter) that does not affect the functionality of a photonic crystal defined by regions 110 and 112 can be positioned between regions 110 and 112). In some embodiments, such as those illustrated in FIG. 1A, the first and second domain regions can be in physical contact with each other.

In some embodiments, the first domain regions comprise a first material and the second domain regions comprise a second material that has at least one property (e.g., index of refraction) that is different from the first material. The first and second domains can form a plurality of bilayers, each bilayer having a period equal to the thickness of the bilayer. For example, in FIG. 1A, domains 110 and 112 form bilayers 114, 115, and 116. The first and second domains can be arranged, in some instances, such that they form a photonic material. For example, in the set of embodiments illustrated in FIG. 1A, domains 110 and 112 are arranged such that they form a 1-dimensionally periodic photonic crystal 118. The photonic materials (or stacks within a photonic material) described herein can include any suitable number of bilayers (e.g., at least 2, at least 3, at least 5, at least 10, at least 20, or more).

In some embodiments, the first or second domain has an isotropic dielectric function while the other of the first and second domains has an anisotropic dielectric function. One of ordinary skill in the art would understand the meaning of the terms "isotropic dielectric function" and "anisotropic dielectric function." The dielectric function of a domain made of a single material corresponds to the dielectric function of that material. The dielectric function of a domain including multiple materials corresponds to the overall dielectric function of the domain (also referred to as an "effective dielectric function"), rather than the dielectric functions of the individual materials within the domain. The dielectric function of a domain (including one material or including multiple materials) can be measured using an ellipsometer. In some embodiments, the dielectric function of a domain along a first coordinate direction can be at least about 5%, at least about 10%, at least about 25%, at least about 50%, or at least about 100% different than the dielectric function of the domain along a second and/or third coordinate direction, the second and third coordinate directions orthogonal to each other and to the first coordinate direction. In some cases, the first domain (e.g., domains 110 in FIG. 1A) has an isotropic dielectric function and the second domain (e.g., domains 112 in FIG. 1A) has an anisotropic dielectric function. In other cases, the first domain (e.g., domains 110 in FIG. 1A) can have an anisotropic dielectric function while the second domain (e.g., domains 112 in FIG. 1A) has an isotropic dielectric function.

By arranging the domains such that they have alternating isotropic/anisotropic dielectric functions, one can discriminate TM-polarized electromagnetic radiation based upon the angle of incidence. For example, in some embodiments, the thicknesses and/or dielectric functions of domains 110 and 112 can be configured such that a high percentage (e.g., at least about 75%, at least about 85%, at least about 95%, at least about 99%, at least about 99.9%, or substantially all) of the TM-polarized electromagnetic radiation that contacts a first incident surface of article 100 (e.g., incident surface 150 and/or incident surface 151) at an angle of incidence within a given range of angles of incidence (e.g., a range of angles of incidence spanning about 45° or less, about 30° or less, about 15° or less, about 5° or less, about 2° or less, or about 1° or less) will be transmitted through the photonic material, while a relatively high percentage (e.g., any of the percentages mentioned above) of the TM-polarized electromagnetic radiation that contacts a second incident surface of article 100 (e.g., surface 150 and/or surface 151) at an angle of incidence outside the given range of angles of incidence will be reflected by the photonic material. In the set of embodiments illustrated in FIG. 1A, range 120 includes a range of angles of incidence that spans about 30° (it includes all angles of incidence between 0° and 30°, thus spanning a range of about 30°). In the set of embodiments illustrated in FIG. 1A, photonic crystal 118 can be configured such that a high percentage of incident TM-polarized electromagnetic radiation with an angle of incidence of 30° or less (i.e., within range 120) is transmitted through photonic crystal 118, while incident TM-polarized electromagnetic radiation with an angle of incidence greater than 30° (i.e., outside range 120) is reflected by photonic crystal 118.

Figure 6A:
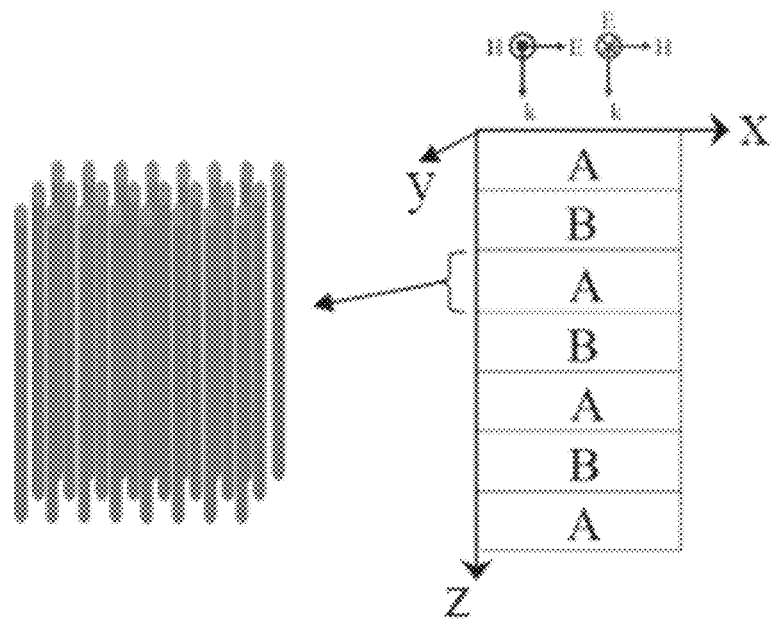

One can construct a domain with an anisotropic dielectric function in a number of ways. In some cases, the domain comprising an anisotropic dielectric function can comprise a material that has an anisotropic dielectric function (also sometimes referred to as birefringent materials) such as, for example, $TiO_2$, calcite, calomel (mercury chloride), beryl, lithium niobate, zircon, mica, and/or mixtures of these. One of ordinary skill in the art would be capable of selecting other materials with anisotropic dielectric functions suitable for use with the embodiments described herein. In some embodiments, a domain comprising an anisotropic dielectric function comprises a combination of at least two materials arranged to have an anisotropic effective dielectric function. For example, in some cases, a combination of at least two materials can be arranged to form a 2-dimensionally periodic photonic crystal. FIG. 6A includes one example of a 2-dimensionally periodic photonic crystal suitable for use as a domain comprising an anisotropic dielectric function. One of ordinary skill in the art, given the present disclosure, would be capable of using a screening test to select materials and/or configure a multi-material system to achieve a desired anisotropic dielectric function within a domain by, for example, fabricating a domain out of a selected material and/or fabricating a multi-material domain and measuring the dielectric function of the domain from various angles to determine whether the domain has an anisotropic dielectric function.

In some embodiments, the first or second domain can have an isotropic magnetic permeability while the other of the first and second domains has an anisotropic magnetic permeability. One of ordinary skill in the art would understand the meaning of the terms "isotropic magnetic permeability" and "anisotropic magnetic permeability." The magnetic permeability of a domain made of a single material corresponds to the magnetic permeability of that material. The magnetic permeability of a domain including multiple materials corresponds to the overall magnetic permeability of the domain (also referred to as an "effective magnetic permeability"), rather than the magnetic permeabilities of the individual materials within the domain. The magnetic permeability of a domain (including one material or including multiple materials) can be measured using, for example, a superconductive magnet or a balance, such as an Evans balance or a Gouy balance. In some embodiments, the magnetic permeability of a domain along a first coordinate direction can be at least about 5%, at least about 10%, at least about 25%, at least about 50%, or at least about 100% different than the magnetic permeability of the domain along a second and/or third coordinate direction, the second and third coordinate directions orthogonal to each other and to the first coordinate direction. In some cases, the first domain (e.g., domain 110 in FIG. 1A) has an isotropic magnetic permeability and the second domain (e.g., domain 112 in FIG. 1A) has an anisotropic magnetic permeability. In some instances, the first domain (e.g., domain 110 in FIG. 1A) has an anisotropic magnetic permeability and the second domain (e.g., domain 112 in FIG. 1A) has an isotropic magnetic permeability.

One might construct a domain with an anisotropic magnetic permeability in a number of ways. For example, a domain comprising an anisotropic magnetic permeability might comprise a combination of at least two materials arranged to have an anisotropic effective magnetic permeability. The two materials might comprise, for example, a metal and a second material (e.g., a metal and a dielectric material). For example, metallo-dielectric materials are described in Pendry, et al., *IEEE transactions on microwave theory and techniques,* 47, No. 11, November 1999. In some cases, the domain comprising an anisotropic magnetic permeability might comprise a 2-dimensionally periodic photonic crystal. As another example, metamaterials are described in Li et al., "Large Absolute Band Gap in 2D Anisotropic Photonic Crystals," *Physical Review Letters,* 81, No. 12, 21 Sep. 1998. One of ordinary skill in the art, given the present disclosure, would be capable of using a screening test to select materials and/or configure a multi-material system to achieve a desired anisotropic magnetic permeability within a domain by, for example, fabricating a domain out of a selected material and/or fabricating a multi-material domain and measuring the magnetic permeability of the domain from various angles to determine whether the domain has an anisotropic magnetic permeability. In some embodiments, a multi-material system can be designed using rigorous simulations of Maxwell's equations to achieve certain effective dielectric constants along particular directions, resulting in a certain degree of anisotropy.

By arranging the domains such that they have alternating isotropic/anisotropic magnetic permeabilities, one can discriminate TE-polarized electromagnetic radiation based upon the angle of incidence. For example, in some embodiments, the thicknesses and/or magnetic permeabilities of domains 110 and 112 can be configured such that a high percentage (e.g., at least about 75%, at least about 85%, at least about 95%, at least about 99%, at least about 99.9%, or substantially all) of the TE-polarized electromagnetic radiation that contacts a first incident surface of photonic crystal 118 (e.g., incident surface 150 and/or incident surface 151) at an angle of incidence within a given range of angles of incidence (e.g., a range of angles of incidence spanning about 45° or less, about 30° or less, about 15° or less, about 5° or less, about 2° or less, or about 1° or less) will be transmitted through the photonic material while a relatively high percentage (e.g., any of the percentages mentioned above) of the TE-polarized electromagnetic radiation that contacts a second incident surface of article 100 (e.g., surface 150 and/or surface 151) at an angle of incidence outside the given range of angles of incidence will be reflected by the photonic material. In the set of embodiments illustrated in FIG. 1A, photonic crystal 118 can be configured such that a high percentage of incident TE-polarized electromagnetic radiation with an angle of incidence within range 120 (which, as mentioned above, spans about 30°) is transmitted through photonic material 118, while a high percentage of incident TE-polarized electromagnetic radiation with an angle of incidence outside range 120 is reflected by photonic material 118.

The ability to discriminate both TM-polarized and TE-polarized electromagnetic radiation based upon angle of incidence can allow one to discriminate incident electromagnetic radiation based on angle of incidence regardless of polarization. In some embodiments, at least about 75%, at least about 85%, at least about 95%, at least about 99%, at least about 99.9%, or substantially all of the electromagnetic radiation that contacts a first incident surface (e.g., surface 150 and/or surface 151 in FIG. 1A) of the photonic material within a range of angles of incidence is transmitted through the photonic material. In some embodiments, at least about 75%, at least about 85%, at least about 95%, at least about 99%, at least about 99.9%, or substantially all of the electromagnetic radiation that contacts a second incident surface (e.g., surface 150 and/or surface 151 in FIG. 1A) of the photonic material outside a range of angles of incidence is reflected by the photonic material. In some embodiments, the range of angles of incidence spans about 45° or less, about 30° or less, about 15° or less, about 5° or less, about 2° or less, or about 1° or less. The spacing and/or material properties of the domains can be selected, in some cases, to tailor the range of incident angles over which electromagnetic radiation is transmitted through the photonic crystal.

Figure 1B:
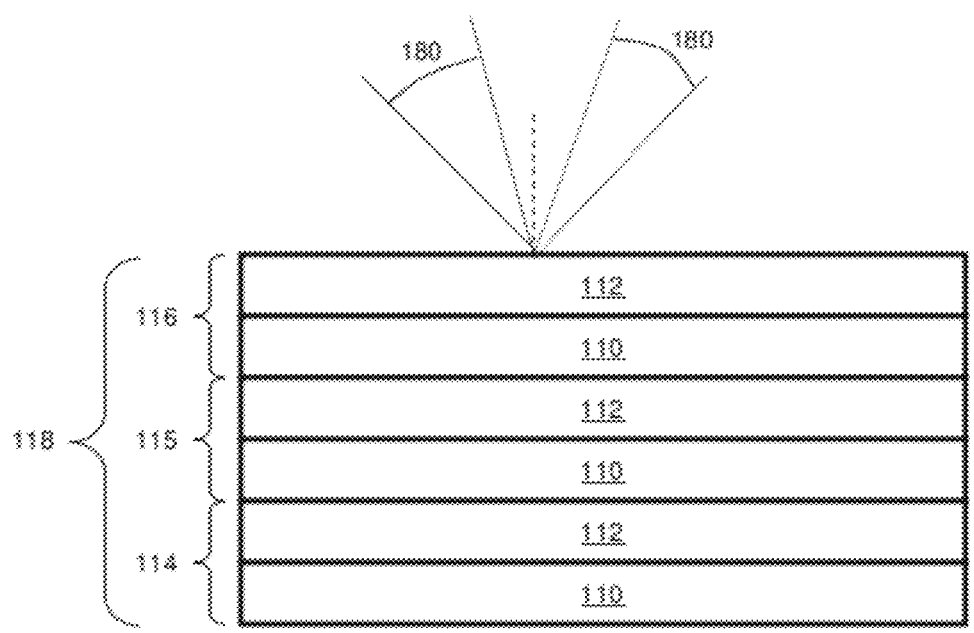

As noted above, in the set of embodiments illustrated in FIG. 1A, the range 120 of the angles of incidence over which incoming electromagnetic radiation is transmitted through photonic material 118 spans about 30°. Physically, the range of angles of incidence illustrated in FIG. 1A would correspond to a cone with an angle at its apex of about 60° (since angles formed on either side of line 160 would fall within the 30° span of angles of incidence). In some embodiments, the range of angles of incidence over which electromagnetic radiation is transmitted through the photonic material can include the 0° angle normal to an incident surface (e.g., indicated by line 160 in FIG. 1A). As noted above, in some embodiments, the range of angles of incidence over which electromagnetic radiation is transmitted through the photonic material does not include the 0° angle normal to the incident surface. For example, the photonic crystal illustrated in FIG. 1B transmits electromagnetic radiation within range 180 of angles of incidence, which spans 30° and includes angles of incidence between about 15° and about 45°. Range 180 in FIG. 1B does not include the 0° angle normal to the incident surface.

In some embodiments, the frequency range over which light is absorbed within a given range of angles of incidence can be broadened by including multiple stacks of to bilayers within the photonic material. For example, in some cases, the photonic material can comprise at least 2, at least 5, at least 10, at least 20, at least 50, at least 100, or more stacks of bilayers. In some embodiments, the bilayers within each of the stacks might have different periods. For example, in some embodiments, the photonic material can comprise a first stack of bilayers with a first period, which can be used to discriminate electromagnetic radiation with wavelengths within a first range of wavelengths, and a second stack of bilayers with a second period, which can be used to discriminate electromagnetic radiation with wavelengths within a second range of wavelengths. One of ordinary skill in the art, given the present disclosure, would be capable of using a screening test to adjust the period(s) of bilayer(s) to achieve a desired angular selectivity over a desired range of wavelengths by, for example, fabricating a stack of bilayers, exposing the bilayers to electromagnetic radiation of a wavelength one desires to discriminate at a variety of angles of incidence, and measuring the amount of the electromagnetic radiation that is transmitted and/or absorbed by the bilayers.

In some cases (e.g., in some instances where domains with anisotropic magnetic permeabilities are not used), the system can include an optional polarizer configured to produce TM-polarized electromagnetic radiation from the incoming electromagnetic radiation such that the TM-polarized electromagnetic radiation is incident on the photonic material. For example, in the set of embodiments illustrated in FIG. 1A, optional polarizer 130 can be positioned proximate photonic crystal 118. As incoming electromagnetic radiation 132 is transmitted through polarizer 130, TM-polarized electromagnetic radiation 134 and TE-polarized electromagnetic radiation 136 can be produced. In some cases, an optional rotator can be provided, which can be configured to rotate at least a portion of (e.g., at least 50%, at least about 75%, at least about 90%, at least about 99%, or substantially all of) the TE-polarized electromagnetic radiation from the polarizer into TM-polarized electromagnetic radiation, which can then be transmitted to the photonic material. For example, in FIG. 1A, optional rotator 138 can be used to rotate at least a portion of TE-polarized electromagnetic radiation 136 into TM-polarized electromagnetic radiation 140, which is then transmitted to photonic material 118.

In addition to 1-dimensionally periodic photonic crystals, selective transmission of incident electromagnetic radiation can be achieved using non-photonic articles with relatively large-scale features. For example, in some embodiments, selective transmission of incident electromagnetic radiation can be achieved using a macroscale filter, optionally made of a reflective material, comprising a plurality of elongated channels formed through the filter. Electromagnetic radiation that intersects an incident surface of the macroscale filter proximate the channel openings and that propagates parallel to or nearly parallel to the channels in the macroscale filter can be transmitted through the macroscale filter. On the other hand, electromagnetic radiation that is incident on reflective portions of the incident surface of the macroscale filter and/or electromagnetic radiation that travels at angles that are far from parallel to the channels within the macroscale filter can be reflected from, rather than transmitted through, the macroscale filter.

Figure 3A:
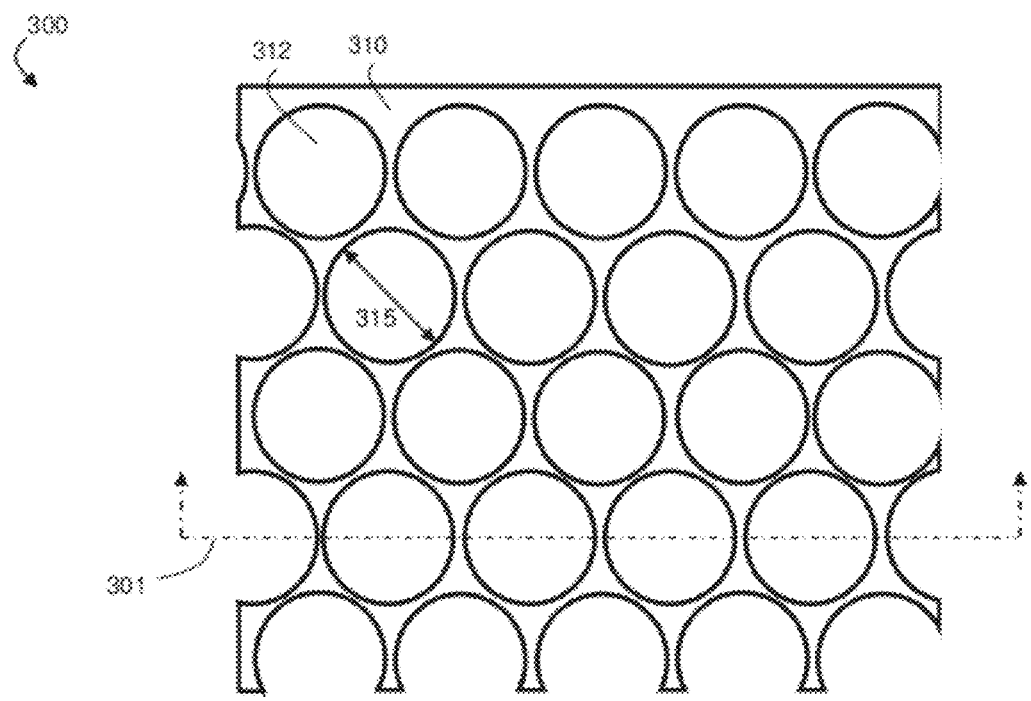
FIGS. 3A-3C show, according to some embodiments, exemplary schematic diagrams of a macroscale filter used to discriminate electromagnetic radiation based on angle of incidence.
Figure 3B:
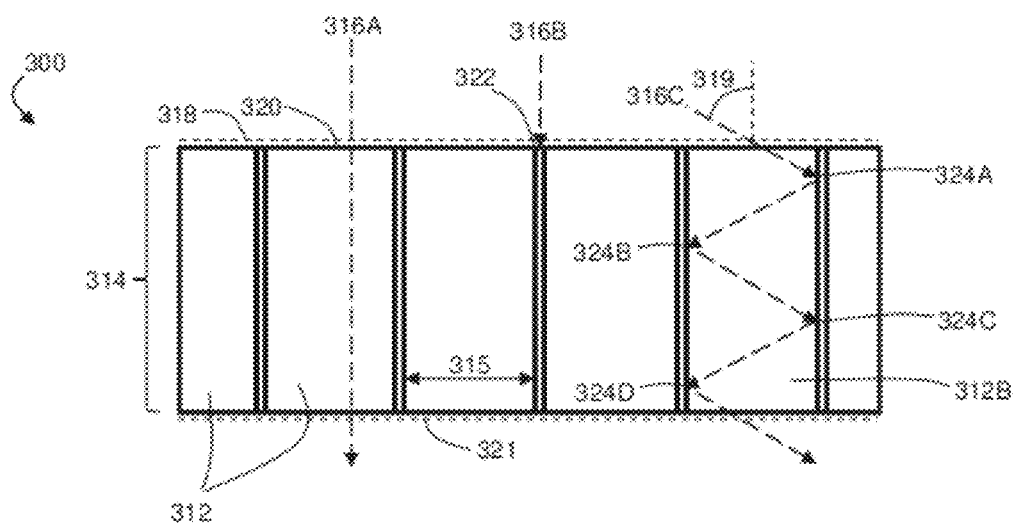

FIGS. 3A-3B are schematic illustrations of an exemplary macroscale filter 300, which can be used to selectively transmit electromagnetic radiation based on angle of incidence. FIG. 3A is a top-view of the filter, while FIG. 3B is a side-view of a cross-section of the filter taken along plane 301. Filter 300 includes a reflective portion 310 and a plurality of elongated channels 312 extending through the thickness 314 of filter 300. Elongated channels 312 include a material that is transparent to incoming electromagnetic radiation so that the electromagnetic radiation can be transmitted through the macroscale filter via channels 312. As shown in FIG. 3B, electromagnetic radiation 316A is nearly parallel to channels 312 in macroscale filter 300. In addition, electromagnetic radiation 316A intersects incident surface 318 of macroscale filter 300 proximate channel opening 320. Accordingly, electromagnetic radiation 316A is transmitted through macroscale filter 300.

Electromagnetic radiation 316B in FIG. 3B is incident upon portion 322 of incident surface 318, which is formed, at least partially, of a reflective material. Accordingly, even though electromagnetic radiation 316B is propagated in a direction that is substantially parallel to channels 312, electromagnetic radiation 316B is reflected back toward the source and is not transmitted through filter 300.

Electromagnetic radiation 316C in FIG. 3B is propagated at an angle relative to incident surface 318 of filter 300, such that electromagnetic radiation 316C and incident surface 318 define incidence angle 319. Electromagnetic radiation 316C is partially transmitted through channel 312B and contacts internal surface portion 324A of filter 300. In FIG. 3B, a portion of electromagnetic radiation 316C is subsequently reflected from portions 324B, 324C, and 324D of channel 312B, and transmitted through filter 300. Another portion of electromagnetic radiation 316C, on the other hand, will be absorbed by the walls of channel 312B or reflected at angles that prevent the transmission of the electromagnetic radiation through the filter. Accordingly, only a portion of electromagnetic radiation 316C that intersects incident surface 318 will be transmitted through filter 300. In the system illustrated in FIGS. 3A-3B, electromagnetic radiation defining a relatively large angle of incidence will be transmitted to a lesser extent than electromagnetic radiation defining a relatively small angle of incidence. For example, for the set of embodiments illustrated in FIG. 3B, the larger angle 319 is, the less electromagnetic radiation will be transmitted through the filter.

While channels 312 illustrated in FIGS. 3A-3B have substantially circular cross-sectional shapes and are substantially cylindrical, other cross-sectional shapes can be employed. In some embodiments, one or more channels formed within a macroscale filter can have a cross-sectional shape that is essentially a circle, essentially an ellipse, essentially an ellipsoid, essentially a polygon (regular or irregular, and including shapes that are essentially triangles, quadrilaterals (including rectangles and squares), pentagons, hexagons, etc.), irregular, or any other suitable cross-sectional shape.

The cross-sectional shape of the channels within the macroscale filter can be, in some cases, substantially constant along their lengths. In some embodiments, at least some of the channels (e.g., at least about 50%, at least about 75%, at least about 90%, at least about 95%, or at least about 99%) have a substantially constant cross-sectional shape along essentially the entire length of the channel. For example, in the set of embodiments illustrated in FIGS. 3A-3B, each of channels 312 has a substantially constant cross-sectional shape (substantially circular) along the entire length of the channel.

In some embodiments, the channels within the macroscale filter can have relatively large cross-sectional diameters. As used herein, the "cross-sectional diameter" of a channel is measured perpendicular to the length of the channel. The cross-sectional diameter of a cylindrical channel is the cross-sectional diameter of that cylinder. For example, in the set of embodiments illustrated in FIGS. 3A-3B, the cross-sectional diameters of the channels correspond to dimension 315. For non-cylindrical channels, the cross-sectional diameter corresponds to the cross-sectional diameter of a theoretical cylinder with the same volume and length as the non-cylindrical channel. In some embodiments, the cross-sectional diameter of at least one channel (e.g., at least about 10%, at least about 25%, at least about 50%, at least about 75%, at least about 90%, at least about 95%, or at least about 99% of the channels) in the macroscale filter is at least about 1 micrometer, at least about 10 micrometers, at least about 100 micrometers, at least about 1 mm, or at least about 10 mm. In some embodiments, the average and/or the median of the cross-sectional diameters of the channels in the filter can be at least about 1 micrometer, at least about 10 micrometers, at least about 100 micrometers, at least about 1 mm, or at least about 10 mm.

As noted above, the channels in the macroscale filter can be elongated and can, in some embodiments, have a relatively large aspect ratio. The aspect ratio of a channel is calculated by dividing the length of the channel by the cross-sectional diameter of the channel. For example, in the set of embodiments illustrated in FIGS. 3A-3B, the aspect ratios of the channels can be calculated by dividing the channel lengths (corresponding to dimension 314) by the channel cross-sectional dimensions 315. In some embodiments, the aspect ratio of at least one channel (e.g., at least about 10%, at least about 25%, at least about 50%, at least about 75%, at least about 90%, at least about 95%, or at least about 99% of the channels) in the macroscale filter is at least about 3, at least about 5, at least about 10, at least about 50, at least about 100, at least about 250, at least about 400, between about 3 and about 500, between about 5 and about 500, between about 50 and about 500, or between about 100 and about 500. In some embodiments, the average and/or the median of the aspect ratios of the channels in the filter can be at least about 3, at least about 5, at least about 10, at least about 50, or at least about 100, at least about 250, at least about 400, between about 3 and about 500, between about 5 and about 500, between about 50 and about 500, or between about 100 and about 500.

In some embodiments, the macroscale filter can be configured such that a relatively small portion of the surface area of at least one incident surface (e.g., incident surface 318 and/or incident surface 321) is occupied by reflective material. For the filter illustrated in FIGS. 3A-3B, the portion of the surface area of the incident surface occupied by the reflective material corresponds to the area of region 310 in FIG. 3A, while the portion of the surface area of the incident surface occupied by the channels corresponds to the sum of the areas of regions 312 in FIG. 3A. In some embodiments, less than about 20%, less than about 10%, less than about 5%, less than about 2%, or less than about 1% of the surface area of an incident surface of the macroscale filter is occupied by reflective material.

Configuring the macroscale filter such that a relatively small portion of the surface area of the incident surface is occupied by reflective material can reduce the amount of electromagnetic radiation with an incidence angle of 0° or close to 0° that is reflected away from the filter (rather than being transmitted through the filter), which can enhance the degree to which the filter can discriminate incoming electromagnetic radiation based on angle of incidence.

Figure 3C:
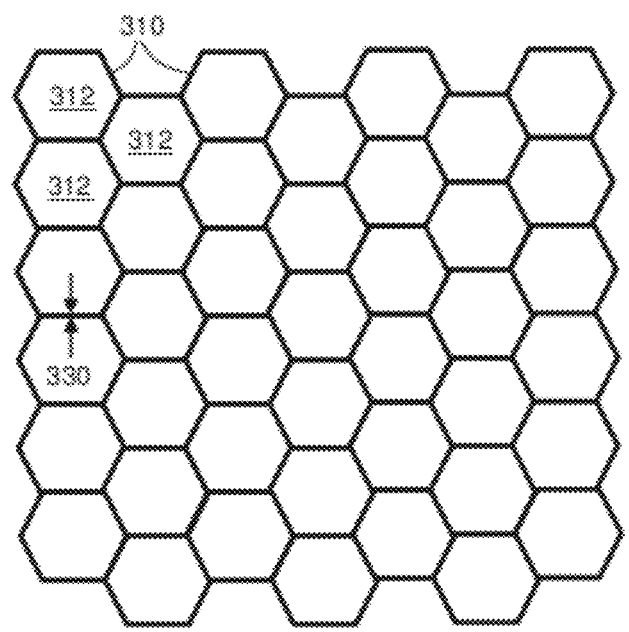

The portion of the surface area of the incident surface occupied by reflective material can be configured to be relatively small by, for example, configuring the channels within the macroscale filter to have relatively large cross-sectional dimensions and/or by configuring the reflective material separating the channels to define thin walls. For example, FIG. 3C includes a top-view schematic diagram of a macroscale filter that includes channels arranged in a hexagonal tiling such that very thin inter-channel wall thicknesses 330 are produced. While hexagonal tiling is illustrated in FIG. 3C, other embodiments can include triangular tiling, quadrilateral tiling (e.g., square tiling), pentagonal tiling, octagonal tiling, or combinations of these and/or other tiling configurations.

A variety of materials can be used to form the reflective portion of the macroscale filter. For example, reflective portion 310 can comprise a metal (e.g., steel, aluminum, gold, silver, nickel, copper, platinum, or mixtures or alloys of these), dielectric photonic crystal structures, or mixtures of these.

A variety of materials can be used to form channels in the macroscale filter. In some embodiments, the channels in the macroscale filter can comprise a material transparent to the electromagnetic radiation the filter is designed to discriminate. In some embodiments, the channels in the macroscale filter can comprise a material with a relative low index of refraction (e.g., less than about 1.5, less than about 1.25, less than about 1.1, or less than about 1.05). For example, the channels in the macroscale filter can comprise a polymer, water, a glass, a gas (e.g., oxygen, nitrogen, argon, helium, or mixtures of these such as air and/or other mixtures), oxides (including metal oxides), and/or mixtures of these. In some embodiments, the channels are fabricated from material(s) selected to be at least partially transparent to the electromagnetic radiation which the filter is designed to discriminate. In some embodiments, at least a portion of the material within the channel is the same as the ambient medium material in which the macroscale filter is to be used. For example, the macroscale filter can comprise holes formed through the reflective portion of the filter, and the holes can be filled with the material in which the filter is located (e.g., ambient air). As one particular example, the macroscale filter can comprise holes formed in a metal and can be used to filter incoming sunlight in an outdoor location, in which case, the channels can be filled with atmospheric air.

As noted above, macroscale filter 300 can be used to discriminate electromagnetic radiation based on its angle of incidence. In some embodiments, at least about 75%, at least about 85%, at least about 95%, at least about 99%, at least about 99.9%, or substantially all of the electromagnetic radiation that contacts a first incident surface (e.g., surface 318 and/or surface 321 in FIG. 3B) of the macroscsale filter within a range of angles of incidence is transmitted through the macroscsale filter. In some embodiments, at least about 75%, at least about 85%, at least about 95%, at least about 99%, at least about 99.9%, or substantially all of the electromagnetic radiation that contacts a second incident surface (e.g., surface 318 and/or surface 312 in FIG. 3B) of the macroscsale filter outside a range of angles of incidence is reflected by the macroscsale filter. In some embodiments, the range of angles of incidence spans about 45° or less, about 30° or less, about 15° or less, about 5° or less, about 2° or less, or about 1° or less. The spacing and/or material properties of the reflective material and/or the elongated channels can be selected, in some cases, to tailor the range of incident angles over which electromagnetic radiation is transmitted through the macroscale filter.

In some embodiments, articles that selectively absorb incident electromagnetic radiation, are provided. For example, in some embodiments, selective absorption of incident electromagnetic radiation can be achieved using a 2-dimensionally periodic photonic crystal. The 2-dimensionally periodic photonic crystal can comprise a continuous region and a plurality of discontinuous regions formed within the continuous region. In some embodiments, a relatively large portion of the electromagnetic radiation that intersects the incident surface of the selective absorber at an incidence angle within a certain range can be absorbed by the selective absorber, and a relatively large portion of the electromagnetic radiation that intersects the incident surface of the selective absorber at an incidence angle outside the range can be reflected by the selective absorber.

FIGS. 4A-4B include perspective-view (FIG. 4A) and front-view (FIG. 4B) schematic illustrations of an exemplary selective absorber 400 that can be used to discriminate electromagnetic radiation based on angle of incidence. Selective absorber 400 includes a 2-dimensionally periodic photonic crystal comprising a continuous region 410 having a first index of refraction (or an effective index of refraction when two or more materials are used to form continuous region 410). In addition, selective absorber 400 includes a plurality of discontinuous regions 412 that have indices of refraction (or effective indices of refraction when two or more materials are used to form discontinuous regions 412) that are different from the index of refraction of continuous region 410. Accordingly, the index of refraction of selective absorber 400, as illustrated in FIG. 4A, varies along orthogonal coordinate directions 413 and 414, and does not substantially vary along coordinate direction 415.

In some embodiments, the selective absorber can be configured to include materials and/or dimensions that allow the selective absorber to discriminate electromagnetic radiation based on the angle of incidence. In some embodiments, at least about 75%, at least about 85%, at least about 95%, at least about 99%, at least about 99.9%, or substantially all of the electromagnetic radiation that contacts a first incident surface (e.g., surface 418 and/or surface 419 in FIG. 4B) of the selective absorber within a range of angles of incidence is absorbed by the selective absorber. In some embodiments, at least about 75%, at least about 85%, at least about 95%, at least about 99%, at least about 99.9%, or substantially all of the electromagnetic radiation that contacts a second incident surface (e.g., surface 418 and/or surface 419 in FIG. 4B) of the selective absorber outside a range of angles of incidence is reflected by the selective absorber. In some embodiments, the range of angles of incidence spans about 45° or less, about 30° or less, about 15° or less, about 5° or less, about 2° or less, or about 1° or less. The spacing and/or material properties of the continuous domain and/or the discontinuous domains can be selected, in some cases, to tailor the range of incident angles over which electromagnetic radiation is absorbed by the selective absorber.

For example, referring to FIG. 4B, selective absorber 400 can be configured such that a relatively large portion of electromagnetic radiation defining an angle of incidence 416 with incident surface 418 is absorbed by the selective absorber, regardless of whether the electromagnetic radiation intersects incident surface 418 proximate the continuous region (e.g., surface portion 420 of incident surface 418) or proximate a discontinuous region (e.g., surface portion 422 of incident surface 418). In some embodiments, selective absorber 400 can be configured such that a relatively large portion of electromagnetic radiation defining an angle of incidence 417, which is greater than angle of incidence 416, is reflected by the selective absorber, regardless of whether the electromagnetic radiation intersects incident surface 418 proximate the continuous region or proximate a discontinuous region.

Regions 412 of the 2-dimensionally periodic photonic crystal can include at least one cross sectional dimension with a length that is less than 3 times, less than 2 times, or less than 1 time the maximum wavelength of the electromagnetic radiation the filter is configured to discriminate. Not wishing to be bound by any particular theory, it is believed that selective absorption can be achieved by configuring the photonic crystal to include features (e.g., regions 412) that establish discontinuities in the dielectric function having cross-sectional dimensions on the order of the wavelengths of electromagnetic radiation the selective absorber is configured to discriminate, and that if the period of the structure is much greater than the wavelength of light being discriminated, then the interactions between the holes will be changed.

In some embodiments, the discontinuous regions 412 within the selective absorber 400 can have relatively small cross-sectional diameters and/or lengths. As used herein, the "cross-sectional diameter" of a discontinuous region is measured in a direction parallel to the incident surface of the selective absorber. The cross-sectional diameter of a cylindrical discontinuous region is the cross-sectional diameter of that cylinder. For non-cylindrical discontinuous regions, the cross-sectional diameter corresponds to the cross-sectional diameter of a theoretical cylinder with the same volume and length (measured parallel to the thickness of the layer in which the discontinuous region is formed) as the non-cylindrical discontinuous region. In some embodiments, the cross-sectional diameter of at least one discontinuous region (e.g., at least about 10%, at least about 25%, at least about 50%, at least about 75%, at least about 90%, at least about 95%, or at least about 99% of the channels) in the selective absorber is less than about 100 micrometers, less than about 50 micrometers, less than about 10 micrometers, less than about 5 micrometers, less than about 2 micrometers, or less than about 1 micrometer, and/or at least about 10 nm, at least about 100 nm, or at least about 500 nm (e.g., between about 10 nm and about 10 micrometers, between about 100 nm and about 5 micrometers, or between about 0.5 micrometers and about 2 micrometers). In some embodiments, the average and/or the median of the cross-sectional diameters of the discontinuous regions in the selective absorber can be less than about 100 micrometers, less than about 50 micrometers, less than about 10 micrometers, less than about 5 micrometers, less than about 2 micrometers, or less than about 1 micrometer, and/or at least about 10 nm, at least about 100 nm, or at least about 500 nm (e.g., between about 10 nm and about 10 micrometers, between about 100 nm and about 5 micrometers, or between about 0.5 micrometers and about 2 micrometers).

In some embodiments, continuous region 410 can be a thin film. For example, in some cases, continuous region 410 can have an average thickness 424 of less than about 100 micrometers, less than about 10 micrometers, less than about 1 micrometer, between about 100 nm and about 10 micrometers, or between about 0.5 micrometers and about 1.5 micrometers. One of ordinary skill in the art would be capable of measuring the thicknesses (and calculating average thicknesses) of thin films using, for example, an ellipsometer, a spectrophotometer, an optical microscope, a transmission-electron microscope, or other suitable method, depending on the type of material from which the thin film is formed.

While discontinuous regions 412 illustrated in FIGS. 4A-4B have substantially circular cross-sectional shapes and are substantially cylindrical, other cross-sectional shapes can be employed. In some embodiments, one or more discontinuous regions 412 formed within a selective absorber can have a cross-sectional shape that is essentially a circle, essentially an ellipse, essentially an ellipsoid, essentially a polygon (regular or irregular, and including shapes that are essentially triangles, quadrilaterials (including rectangles and squares), pentagons, hexagons, etc.), irregular, or any other suitable cross-sectional shape.

The cross-sectional shape of the discontinuous regions 412 within the selective absorber 400 can be, in some cases, substantially constant along their lengths. In some embodiments, at least some of discontinuous regions 412 (e.g., at least about 50%, at least about 75%, at least about 90%, at least about 95%, or at least about 99%) have a substantially constant cross-sectional shape along essentially the entire length of the discontinuous region. For example, in the set of embodiments illustrated in FIGS. 4A 4B, each of discontinuous regions 412 has a substantially constant cross-sectional shape (substantially circular) along the entire length of the discontinuous region.

Discontinuous regions 412 can have a variety of aspect ratios. The aspect ratio of regions 412 is calculated by dividing the length of the discontinuous region (as measured in a direction parallel to the thickness of the material in which the discontinuous region is formed), to the cross-sectional diameter of the discontinuous region. For example, in the set of embodiments illustrated in FIGS. 4A-4B, the aspect ratio of regions 412 is calculated by dividing the length of dimension 424 by the length of cross-sectional diameter 426. In some embodiments, the aspect ratio of at least one discontinuous region 412 (e.g., at least about 10%, at least about 25%, at least about 50%, at least about 75%, at least about 90%, at least about 95%, or at least about 99% of the discontinuous regions) in the selective absorber is at least about 0.75, at least about 2, at least about 5, at least about 10, at least about 20, between about 0.75 and about 25, between about 2 and about 25, or between about 5 and about 25.

In some embodiments, the average of the nearest neighbor distances between regions 412 can be less than about 100 micrometers, less than about 50 micrometers, less than about 10 micrometers, less than about 5 micrometers, or less than about 2 micrometers, and/or at least about 10 nm, at least about 100 nm, at least about 500 nm, or at least about 1 micrometer (e.g., between about 10 nm and about 100 micrometers, between about 100 nm and about 10 micrometers, or between about 0.5 micrometers and about 2 micrometers). The nearest neighbor distance for a first discontinuous region is calculated as the distance between the center of the first discontinuous region and the center of the nearest discontinuous region relative to the first discontinuous region. For example, in the set of embodiments illustrated in FIG. 4A, dimension 440 is used to indicate the nearest neighbor distance between regions 412A and 412B. The average of the nearest neighbor distances of multiple discontinuous regions is calculated as the number average.

In some embodiments, discontinuous regions 412 can include one or more materials positioned within voids of the continuous region 410. For example, voids can be formed within continuous region 410, and one or more materials can be deposited into the voids to form discontinuous regions 412. In some cases, discontinuous regions 412 can comprise openings formed within continuous region 410. In some such embodiments, the chemical composition of discontinuous regions 412 can be substantially the same as the chemical composition of the environment surrounding the selective absorber (e.g., vacuum, ambient air, etc.).

Selective absorber 400 can include a variety of types of materials. Examples of materials that can be used to form the continuous region 410 of the 2-dimensionally periodic photonic crystal include, but are not limited to, metals (e.g., tungsten (e.g., single-crystal tungsten), tantalum, platinum, palladium, silver, gold, etc.), semiconductors (e.g., silicon, germanium, etc.), or dielectric materials (e.g., titania, zirconia). In one particular set of embodiments, a 2-dimensionally periodic photonic crystal can comprise a layer of tungsten in which holes are formed. In some embodiments, the selective absorber can be formed of a material with a relatively low emissivity. In some embodiments, the selective absorber can comprise a material with an emissivity of less than about 0.3, less than about 0.2, less than about 0.1, or less than about 0.05, for example at the temperature at which the selective absorber is designed to operate and at the wavelength(s) of electromagnetic radiation the selective absorber is configured to absorb.

Structures capable of discriminating electromagnetic radiation based on the angle of incidence could find uses in a wide variety of applications. For example, articles capable of selectively absorbing and/or transmitting electromagnetic radiation based upon the angle of incidence can be useful in applications where it is desirable to "trap" incoming electromagnetic radiation of a known incidence angle. One example of such an application is solar energy conversion. In many commercial solar conversion systems (e.g., solar to thermal to electrical conversion systems, concentrated solar photovoltaic systems, etc.) incident angle of the sun can be controlled for. For example, solar to electrical photovoltaic conversion panels and concentrated solar photovoltaic system panels can be configured to track the motion of the sun. In many systems currently in use, a portion of the incident solar energy is typically reflected or reemitted from the receiving device (e.g., the photovoltaic panel, the absorber, etc.), which results in (often substantial) losses. Since the angle of outgoing electromagnetic radiation reflected from the receiving device is typically substantially different than the angle of the incoming electromagnetic radiation from the sun, articles capable of selectively transmitting electromagnetic radiation based on the angle of incidence could be used to "trap" the reflected radiation, redirecting it back towards the receiving device. In addition, selective absorbers could be used to produce a relatively large amount of heat, without the need for concentrators such as lenses, mirrors, or other devices.

Accordingly, in some embodiments, the articles described herein (including article 100, macroscale filter 300, and/or selective absorber 400) can be configured such that they transmit the electromagnetic radiation incident on the article and/or heat derived from the electromagnetic radiation incident on the article to a system capable of producing energy (e.g., in the form of electricity) from the electromagnetic radiation and/or heat transmitted from the article. In some cases, the photonic materials, articles, and systems described herein can be configured to transmit electromagnetic radiation to and/or be a part of a photovoltaic cell (e.g., a solar photovoltaic cell, a thermophotovoltaic cell, etc.). In some cases, the photonic materials, articles, and systems described herein can be configured to transmit heat to and/or be a part of an absorber (e.g., an absorber proximate an emitter configured to transmit electromagnetic radiation emitted by the emitter to a photovoltaic cell, an absorber configured to exchange heat with a device capable of producing electricity from heat (e.g., a heat engine)).

Figure 5A:
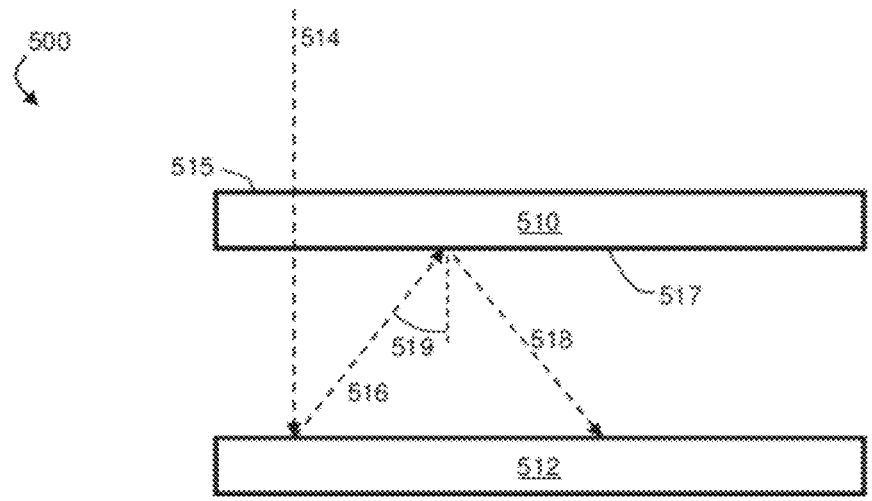
FIGS. 5A-5C are exemplary schematic diagrams of energy generation systems, according to one set of embodiments.

In some embodiments, the systems, articles, and methods described herein can be used in photovoltaic energy generation systems. FIG. 5A includes an exemplary schematic diagram of a photovoltaic energy generation system 500 comprising a selective transmitter 510 (e.g., article 100 and/or macroscale filter 300) and a photovoltaic cell 512 configured to receive electromagnetic radiation from selective transmitter 510 and convert the electromagnetic radiation to electricity. In this set of embodiments, electromagnetic radiation 514 (from a source such as the sun, which is not illustrated) is incident on incident surface 515 of selective transmitter 510. Because electromagnetic radiation 514 establishes an normal incidence angle (i.e., an incidence angle of 0°) with incident surface 515 of selective transmitter 510, electromagnetic radiation 514 is transported through selective transmitter 510. Upon reaching photovoltaic cell 512, at least a portion of electromagnetic radiation 514 is absorbed by photovoltaic cell 512. Another portion 516 of electromagnetic radiation 514 is reflected by photovoltaic cell 512 at an angle different from the original incidence angle of electromagnetic radiation 514. Selective transmitter 510 can be configured such that, when electromagnetic radiation portion 516 reaches incident surface 517 of selective transmitter 510, a relatively large portion 518 of electromagnetic radiation 516 is reflected back to photovoltaic cell (e.g., because the incidence angle 519 is relatively large). Eventually, portion 518 of electromagnetic radiation reaches photovoltaic cell 512, where at least some of portion 518 is absorbed. In the absence of selective transmitter 510, the electromagnetic radiation from portion 518 that is absorbed by photovoltaic cell 512 would have been reflected out of the system, thereby reducing system efficiency. Accordingly, in this set of embodiments, the use of selective transmitter 510 increases the overall system efficiency.

In some embodiments, the systems, articles, and methods described herein can be used in thermophotovoltaic systems. In thermophotovoltaic systems, electromagnetic radiation (e.g., sunlight) is not absorbed directly by a photovoltaic material, but rather, is absorbed by an absorber. In some cases, the absorber can selectively emit and/or be thermally coupled to a selective emitter, which then thermally radiates electromagnetic radiation. The electromagnetic radiation emitted by the emitter can then be absorbed by a photovoltaic cell.

Figure 5B:
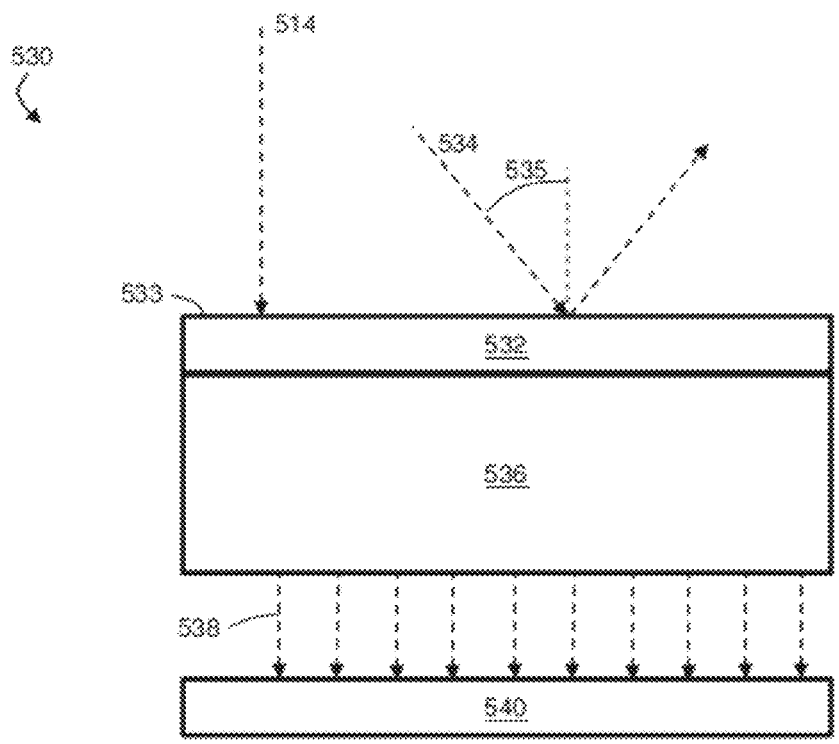

FIG. 5B includes an exemplary schematic diagram of a thermophotovoltaic energy generation system 530, according to one set of embodiments. In this set of embodiments, selective absorber 532 (e.g., selective absorber 400 as shown in FIG. 4) is configured to absorb electromagnetic radiation to generate heat. In this set of embodiments, electromagnetic radiation 514 (from a source such as the sun, which is not illustrated) is incident on incident surface 533 of selective absorber 532. Because electromagnetic radiation 514 establishes an normal incidence angle (i.e., an incidence angle of 0°) with incident surface 533 of selective absorber 532, at least a portion of electromagnetic radiation 514 is absorbed by selective absorber 532. Electromagnetic radiation 534, on the other hand, establishes a relatively large angle of incidence 535 with incident surface 533. Accordingly, a large portion (or all) of electromagnetic radiation 534 is reflected from incident surface 533 of selective absorber 532. By absorbing electromagnetic radiation incident only over a narrow range of angles of incidence, absorber 532 can be heated to a relatively high temperature. Not wishing to be bound by any particular theory, it is believed that selective absorption leads to higher temperatures because heat escapes much more slowly in selective absorbers than in non-selective absorbers, as predicted by Kirchoff's Law.

Although selective absorber 532 and selective emitter 536 are illustrated as being in direct contact in FIG. 5B, in other embodiments, one or more materials (e.g., a thermally conductive material such as a metal) can be positioned between selective absorber 532 and selective emitter 536. Selective absorber 532 can be configured to transfer heat to selective emitter 536, for example, by placing the absorber and the emitter in direct contact, by positioning one or more heat exchangers between the absorber and the emitter, or by any other suitable method.

In some embodiments, selective emitter 536 is configured to emit electromagnetic radiation when it is heated. For example, selective emitter 536 can comprise a material having a relatively high emissivity (e.g., a material having an emissivity of at least about 0.7, at least about 0.8, or at least about 0.9, for example at the temperature at which the selective emitter is designed to operate and at the wavelength(s) of electromagnetic radiation the selective emitter is configured to radiate). Exemplary high emissivity materials include, but are not limited to, quartz, silicon carbon (e.g., graphite, carbon black, etc.), carbide, oxidized steel, and the like. In FIG. 5B, electromagnetic radiation 538 emitted from selective emitter 536 is absorbed by thermophotovoltaic cell 540, which generates energy (e.g., in the form of electricity).

Figure 5C:
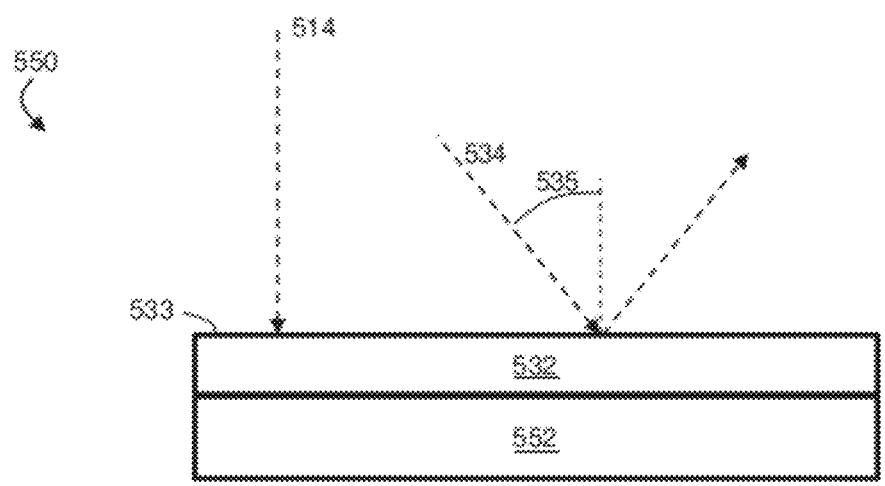

In some embodiments, rather than heating a selective emitter, selective absorber 532 can be used to heat a working fluid, which can be used to power a heat engine. FIG. 5C is a schematic illustration of an energy generation system 550 in which selective absorber 532 is configured to provide heat to a working fluid within conduit 552. The fluid within conduit 552 can be a gas (e.g., to power a gas turbine or other energy generation device using gas as the working fluid) or a liquid (e.g., to power a steam turbine or other energy generation device in which the working fluid is a liquid at some point in the energy generation process).

Generally, thermophotovoltaic systems and heat engine-based systems are more efficient when they operate at high temperatures. In many previous systems, high temperatures can be achieved by using lenses, mirrors, or other suitable devices to focus the electromagnetic radiation (e.g., sunlight) onto the absorber. The selective transmitters and absorbers described herein can be used to replace traditional concentrators in many such systems and/or enhance their effect, thereby improving system performance.

In some embodiments, the articles for discriminating electromagnetic radiation based on angle of incidence described herein can comprise a refractory metal (e.g., niobium, molybdenum, tantalum, tungsten, osmium, iridium, ruthenium, zirconium, titanium, vanadium, chromium, rhodium, hafnium, and/or rhenium) and/or another refractory material. The use of refractory materials can allow one to fabricate a articles that are capable of withstanding relatively high temperatures (e.g., at least about 1000° C., at least about 1500° C., or at least about 2000° C.). In some embodiments, the article for discriminating electromagnetic radiation can comprise compounds such as tungsten carbide, tantalum hafnium carbide, and/or tungsten boride. In some embodiments, the article for discriminating electromagnetic radiation can comprise noble metals, including noble metals with high melting points (e.g., platinum, palladium, gold, and silver), diamond, and/or cermets (i.e., compound metamaterials including two or more materials (e.g., tungsten and alumina) which can be, in some embodiments, broken up into pieces smaller than the wavelength of visible light). In some embodiments, the article for discriminating electromagnetic radiation can comprise a combination of two or more of these materials.

The present invention also relates to methods for discriminating electromagnetic radiation based on the angle of incidence. The methods can comprise, for example, exposing any of the articles described herein to electromagnetic radiation and discriminating the electromagnetic radiation to any of the extents described herein. In some embodiments, the methods comprise configuring other components (e.g., absorbers, energy conversion devices such as photovoltaic cells, heat engines, etc.) to receive heat and/or electromagnetic radiation from an article configured to discriminate electromagnetic radiation, for example, as part of an energy generation system. Methods of the invention also include methods for fabricating the articles used to discriminate electromagnetic radiation described herein.

A variety of methods, according to certain aspects of the invention, can be used to form the articles for discriminating electromagnetic radiation based on angle of incidence described herein. In some embodiments, various components can be formed from solid materials, in which materials (e.g., layers of materials), holes, discontinuous regions, and the like can be formed via micromachining; film deposition processes such as spin coating, chemical vapor deposition, and/or physical vapor deposition (including sputtering); laser fabrication; photolithographic techniques; etching methods including wet chemical or plasma processes; electrochemical processes; and the like. See, for example, "Silicon Micromechanical Devices" by Angell et al., Scientific American, Vol. 248, pages 44-55, 1983. For example, at least a portion of a 1-dimensionally periodic photonic crystal can be formed by depositing multiple thin-films of material via, for example, sputtering. As another example, in one set of embodiments, at least a portion of a 2-dimensionally periodic photonic crystal can be formed by etching (e.g., laser etching) features into a substrate and/or layer such as a metal substrate and/or layer (e.g., aluminum, steel, copper, tungsten, and the like). In some embodiments, the articles described herein can be fabricated using milling techniques (including relatively large-scale milling techniques), sheet material (e.g., sheet metal) working, and the like. Technologies for precise and efficient fabrication of various material layers and/or devices described herein are known to those of ordinary skill in the art.

U.S. Provisional Patent Application Ser. No. 61/365,732, filed Jul. 19, 2010, and entitled "Discriminating Electromagnetic Radiation Based on Angle of Incidence" is incorporated herein by reference in its entirety for all purposes. All patents, patent applications, and documents cited herein are hereby incorporated by reference in their entirety for all purposes.

The following examples are intended to illustrate certain embodiments of the present invention, but do not exemplify the full scope of the invention.

Example 1

This example describes numerical simulations of a class of material systems that discriminate electromagnetic radiation (including visible light) based on the angle of incidence of the electromagnetic radiation on the material, over a broad range of frequencies, and irrespective of the polarization of the electromagnetic radiation. Unique properties of these systems emerge from exploring photonic crystals whose constituents have anisotropic dielectric permeabilities. Among other potential uses, such systems could be of interest for solar energy applications, where they could enable a highly enhanced green-house effect.

In some cases, it would be beneficial if electromagnetic radiation (e.g., visible light) incident at a particular angle (or a range of angles) would be nearly perfectly transmitted, while other angles of incidence would be nearly perfectly reflected, independent of the incoming polarization, and for as wide a range of frequencies as possible. This example presents a system that precisely opens such desired angular gaps. Using realistic constituent material parameters, numerical calculations are presented that demonstrate a system in which electromagnetic radiation close to normal incidence is nearly perfectly transmitted for a wide range of frequencies, independent of the polarization. In contrast, electromagnetic radiation with incidence angles further from the normal (e.g. 22.5°-90°) can be nearly perfectly reflected over a fractional frequency bandgap of greater than 100%. In some cases, the structures can include photonic crystals whose constituents have an anisotropic dielectric function and/or an anisotropic magnetic permeability.

The system described in this example for opening an angular photonic gap includes a one-dimensionally (1D) periodic photonic crystal whose constituents possess anisotropic properties. To demonstrate the fundamental physics principle at work in this system, FIG. 6A includes a specific example of such a metamaterial that opens an angular gap for the TM polarization (i.e., the electric field is in the plane of incidence) only. Later in this example, a generalized approach will be shown for both polarizations and wide frequency ranges. Angular discrimination of TM electromagnetic radiation can be achieved by introducing anisotropy in the dielectric function ($\in$) of one of the layers (e.g., layer A). In this first example, one can assume that layer A has an anisotropic effective dielectric function $\in_A=(1.23, 1.23, 2.43)$ whereas layer B has an isotropic effective dielectric function $\in_B=1.23$. To accomplish this anisotropy, one could use naturally existing materials with anisotropic dielectric functions, such as $TiO_2$ ($\in_{TiO_2}=(2.6^2, 2.6^2, 2.9^2)$ at 590 nm), and/or explore a metamaterial approach.

An example of a metamaterial system that in the long wavelength limit possesses an effective epsilon of (1.23, 1.23, 2.43) is shown on the left-hand side of FIG. 6A, which includes a two dimensional (2D) periodic square lattice of dielectric rods having radius r=0.2 d where d (the in-plane period) can be calculated as: d=0.1 a. Here, a corresponds to the thickness of each bilayer. Since it is known that a TM reflection window opens at 45°, one can choose the thickness of layer A ($h_A$) such that the size of the TM fractional gap is maximized, which happens at the quarter-wave condition ($h_A n_A^{TM} \cos(\theta_A^{TM})\omega_o/c = h_B n_B^{TM} \cos(\theta_B^{TM})\omega_o/c$), where $\omega_o$ is the frequency at the center of the gap, $h_A$ is the thickness of layer A, $h_B$ is the thickness of layer B, $n_A^{TM}$ is the index of refraction of TM polarized electromagnetic radiation in material A, $n_B^{TM}$ is the index of refraction of TM polarized electromagnetic radiation in material B, $\theta_A^{TM}$ is the angle that TM polarized electromagnetic radiation makes with respect to the normal of layer A, $\theta_B^{TM}$ is the angle of incidence that TM polarized electromagnetic radiation makes with respect to the normal of layer B, and c is the speed of light in a vacuum (i.e., about $3\times10^8$ m/s). This results in $h_A$=0.46a. The metamaterial system shown to the left of FIG. 6A also includes rods formed of an isotropic material, with the dielectric function of the rods being 12.25 ($\epsilon_{rods}$=12.25). In a 2D square lattice of dielectric rods, modes having their E-field along the rods are substantially more concentrated inside the rods and therefore experience the high E of the rods. On the other hand, modes having their E-field in the periodicity plane experience average E smaller than that along the rods, hence the anisotropy in effective epsilon of the entire layer. Frequency domain simulations (not discussed here) show that in the low frequency limit, the metamaterial has effective E=(1.23, 1.23, 2.43).

The right-hand side of FIG. 6A is a schematic diagram of normally incident TM-polarized and TE-polarized electromagnetic radiation; originating from air, incident on the above-described multilayer structure (with period a, $\epsilon_A$=(1.23, 1.23, 2.43), and $\epsilon_B$=1.23). Since $\vec{E}$ lies in the xy-plane, both polarizations experience $n_A=n_B=\sqrt{1.23}$, so there is no index contrast. Because of the absence of any contrast in the refractive index, there is no photonic bandgap and normally incident electromagnetic radiation of all frequencies and both polarizations is transmitted through this metamaterial structure, apart from the small reflections at boundaries between the structure and air.

Figure 6B:
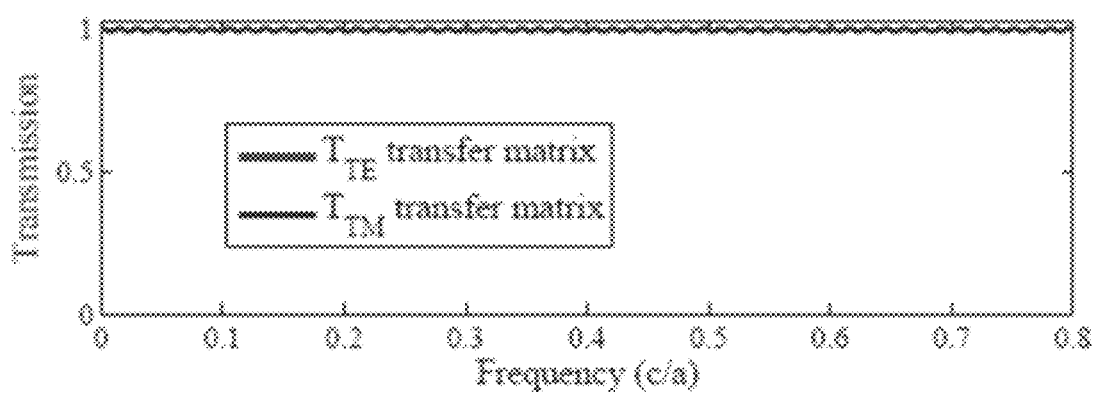

FIG. 6B illustrates transmission spectra for TE-polarized and TM-polarized electromagnetic radiation, normally incident from air on 30 bilayers of the structure in FIG. 6A. The transmission spectra shown in FIG. 6B were obtained using the Transfer Matrix Method (TMM) as described in Pochi Yeh, *Optical Waves in Layered Media*, Chapter 5 (pages 102-110) and Chapter 6 (pages 118-128) (John Wiley & Sons Inc., 1988), which is incorporated herein by reference. As seen in FIG. 6B, when the angle of incidence is non-zero (i.e., incident electromagnetic radiation makes an angle $\theta_{inc}\neq 0$ with the normal), different effects are observed relative to situations in which the angle of incidence is zero (i.e., incident electromagnetic radiation is normal to the surface). FIGS. 6C and 6D are schematic diagrams showing TM-polarized (in FIG. 6C) and TE-polarized (in FIG. 6D) electromagnetic radiation incident at a nonzero angle from air ($n_{inc}$=1) on the structure in FIG. 6A. As illustrated in the schematic of FIG. 6C, TM-polarized electromagnetic radiation incident at $\theta_{inc}\neq 0$ now has $E_z\neq 0$, and thus experiences an index contrast ($n_A^{TM}\neq n_B^{TM}=\sqrt{1.23}$); therefore, one expects a photonic bandgap (of a certain frequency width) and hence strong reflections for TM-polarized electromagnetic radiation in this bandgap. In contrast, TE-polarized electromagnetic radiation incident at an angle $\theta_{inc}\neq 0$ still has $E_z=0$ and thus experiences no index contrast as shown in FIG. 6D ($n_A=n_B=\sqrt{1.23}$); therefore, it is transmitted for all frequencies. Therefore, normally incident TM-polarized electromagnetic radiation is transmitted, while TM-polarized electromagnetic radiation incident at nonzero angles is reflected in a certain frequency range. FIG. 6E includes transmission spectra (obtained from TMM) for TE-polarized and TM-polarized polarized electromagnetic radiation incident at 45° from air on 30 bilayers of the structure in FIG. 6A, in the case when anisotropic layer A is made from a homogeneous material. From FIG. 6E, it can be seen that TM-polarized electromagnetic radiation incident at nonzero angles is reflected in a frequency range of 9.3%. Generally, a frequency bandgap of X % is calculated by dividing $\Delta\Omega$ by $\Omega_{mid}$, wherein $\Delta\Omega$ is the difference between the highest and lowest frequencies in the bandgap and $\Omega_{mid}$ is the average of the highest and lowest frequencies in the bandgap.

FIG. 6E also includes a transmission spectrum (obtained from the FDTD method described in Oskooi et al., "MEEP: A flexible free-software package for electromagnetic simulations by the FDTD method," *Computer Physics Communications*, 181, pp. 687-702 (2010)) for TM-polarized electromagnetic radiation incident at 45° from air on 30 bilayers of the structure in FIG. 6A, in the case when anisotropic layer A is not made from a homogeneous material, but is made from a metamaterial including a square lattice of dielectric rods. In this case, a TM photonic bandgap opens and closely overlaps with the TM gap obtained from TMM for the uniform dielectric case. The above explains the physical mechanism based on which the proposed structures described herein discriminate electromagnetic radiation with respect to the angle of incidence in that particular frequency range.

Before discussing numerical results for transmission of various angles, polarizations, and frequencies from this multilayer structure, analytical expressions for the refractive index $n_A$ of the anisotropic layer are provided. A simple calculation starting from Maxwell's equations yields the following refractive indices ($n=C/v_{phase}$, wherein c is the speed of light in a vacuum (about $3\times10^8$ m/s) and $v_{phase}$ is the speed of light in the phase for which the refractive index is being determined) experienced by TE-polarized and TM-polarized electromagnetic radiation respectively in the anisotropic layer A:

$$n_A^{TE} = \frac{1}{\sqrt{\dfrac{\cos^2\theta_A^{TE}}{\mu_{xx}^A \varepsilon_{yy}^A/\mu_o\varepsilon_o} + \dfrac{\sin^2\theta_A^{TE}}{\mu_{xx}^A \varepsilon_{yy}^A/\mu_o\varepsilon_o}}} \quad (1)$$

$$n_A^{TM} = \frac{1}{\sqrt{\dfrac{\cos^2\theta_A^{TM}}{\mu_{yy}^A \varepsilon_{xx}^A/\mu_o\varepsilon_o} + \dfrac{\sin^2\theta_A^{TM}}{\mu_{yy}^A \varepsilon_{zz}^A/\mu_o\varepsilon_o}}} \quad (2)$$

where $\theta_A^{TE}$ and $\theta_A^{TM}$ are the angles that TE-polarized and TM-polarized electromagnetic radiation, respectively, make with respect to the normal as they propagate in layer A, $\mu_{xx}^A$ is the magnetic permeability of material A in the x-direction, $\mu_{yy}^A$ is the magnetic permeability of material A in the y-direction, $\mu_{zz}^A$ is the magnetic permeability of material A in the z-direction, $\epsilon_{xx}^A$ is the dielectric function of material A in the x-direction, $\epsilon_{yy}^A$ is the dielectric function of material A in the y-direction, $\epsilon_{zz}^A$ is the dielectric function of material A in the z-direction, $\epsilon_o$ is the dielectric function of vacuum, and $\mu_o$ is the magnetic permeability of vacuum. $\mu_{xx}^B$ is the magnetic permeability of material B in the x-direction, $\mu_{yy}^B$ is the magnetic permeability of material B in the y-direction, $\mu_{zz}^B$ is the magnetic permeability of material B in the z-direction, $\epsilon_{xx}^B$ is the dielectric function of material B in the x-direction, $\epsilon_{yy}^B$ is the dielectric function of material B in the y-direction, $\epsilon_{zz}^B$ is the dielectric function of material B in the z-direction. These values can be obtained from Snell's law, which in this anisotropic case is:

$$n_A^{TE}\sin\theta_A^{TE} = n_{air}\sin\theta_{inc} \quad (3)$$

$$n_A^{TM}\sin\theta_A^{TM} = n_{air}\sin\theta_{inc} \quad (4)$$

From the expressions for $n_A^{TE}$ and $n_A^{TM}$, one can see that TE-polarized electromagnetic radiation is affected only by $\in_{yy}^A$, $\mu_{xx}^A$, and $\mu_{zz}^A$, while TM-polarized electromagnetic radiation is affected only by $\mu_{yy}^A$, $\in_{xx}^A$ and $\in_{zz}^A$. In particular, TM-polarized electromagnetic radiation is affected by $\in_{zz}^A$, while TE-polarized electromagnetic radiation is not. One can also observe that for angles $\theta_A$ close to the normal, $\sin\theta_A \approx 0$. Accordingly, in view of Equations 1 and 2, $n_A$ increases only slightly with increasing anisotropy. However, for incidence angles not close to the normal, $n_A$ increases more rapidly with increasing anisotropy, and therefore higher anisotropy in $\in$ or $\mu$ results in higher index contrast and wider frequency gaps at those angles.

The multilayer structure illustrated in FIG. 6A discriminates angles only for TM-polarized electromagnetic radiation. One can generalize this structure and design a different multilayer structure which is capable of discriminating angles of incidence irrespective of the polarization of the electromagnetic radiation. Such a multilayer structure can include anisotropy in both the dielectric function and in the magnetic permeability. More specifically, the proposed structure can have $\in_B=\mu_A=\gamma_1$ while $\in_A=\mu_B=(\gamma_1,\gamma_1,\gamma_2)$. Note that a structure having $\in_A=\mu_A=(\gamma_1,\gamma_1,\gamma_2)$ and $\in_B=\mu_B=\gamma_1$ would work equally well and would have a larger fractional frequency gap (at the quarter-wave condition which is satisfied differently at different incidence angles). The structure illustrated and analyzed in FIGS. 7A-7C can offer somewhat more flexibility in material choice, in the sense that anisotropic $\in$ and $\mu$ would not have to occur in the same material.

Figure 7A:
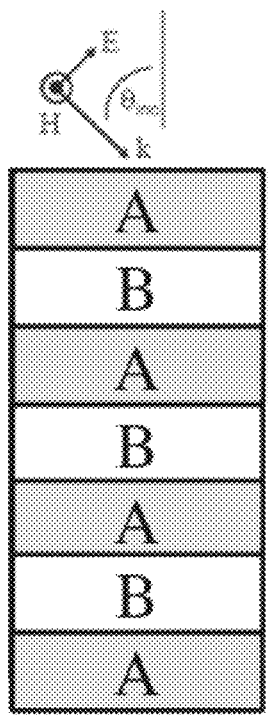
FIGS. 7A-7C are (A-B) schematic diagrams illustrating exemplary 1-dimensionally periodic photonic crystals and (C) an exemplary contour plot of the change in the size of a bandgap as a function of the incidence angle and the degree of anisotropy, according to some embodiments.
Figure 7B:
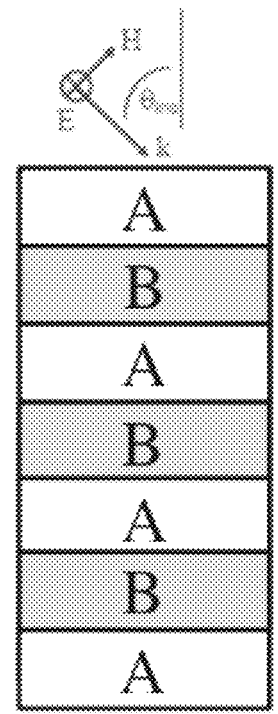
Figure 7C:
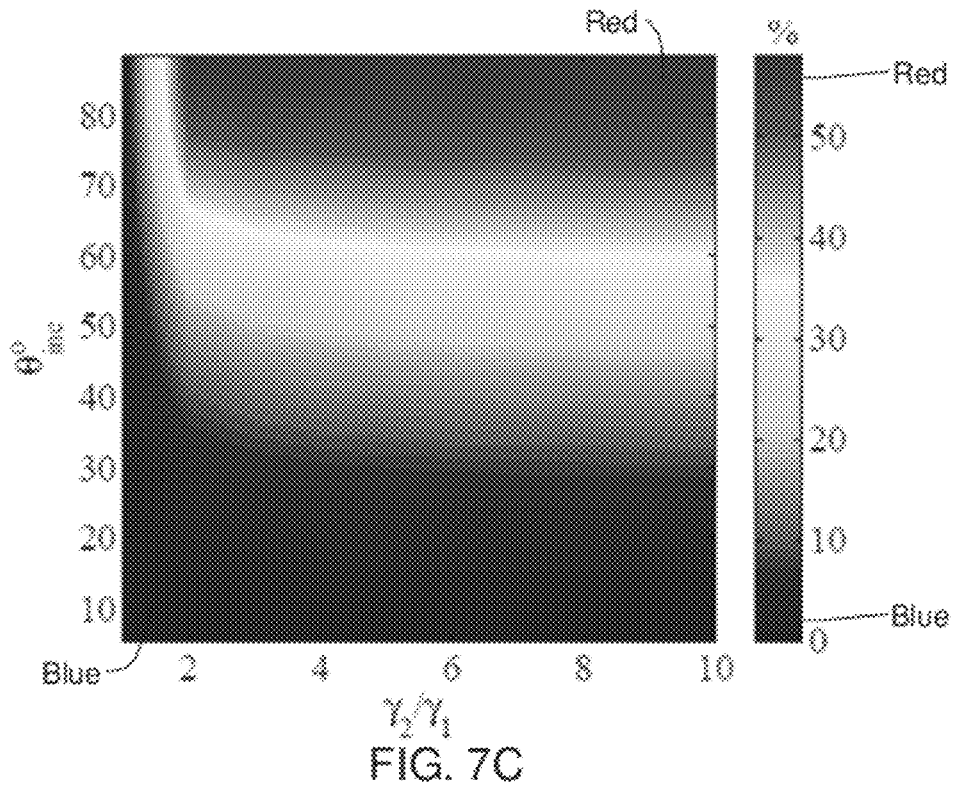

For simplicity, we consider the case $\in_{inc}=\mu_{inc}=\gamma_1$ in this example. FIGS. 7A-7B includes schematic diagrams showing (A) TM-polarized and (B) TE-polarized electromagnetic radiation incident at nonzero angles from $\in_{inc}=\mu_{inc}=\gamma_1$ on an anisotropic multilayer structure with $\in_A=\mu_B=(\gamma_1,\gamma_1,\gamma_2)$, $\in_B=\mu_A=\gamma_1$. Here, $\gamma_2 \neq \gamma_1$. In both of these cases, electromagnetic radiation experiences index contrasts and hence photonic bandgaps. For example, as shown in the schematic of FIG. 7A, TM-polarized electromagnetic radiation incident from air at a nonzero angle on this structure experiences a photonic bandgap because according to Eq. (2), $n_B^{TM}=\sqrt{\gamma_1}$ while $n_A^{TM}\neq\sqrt{\gamma_1}$. On the other hand, TE-polarized electromagnetic radiation incident (from air) at the same nonzero angle also experiences an index contrast because according to Eq. (1), $n_A^{TE}=\sqrt{\gamma_1}$ while $n_B^{TE}\neq\sqrt{\gamma_1}$. FIG. 7C includes a contour plot showing how the relative size of the TE (and also TM) photonic bandgap changes with $\theta_{inc}$ and with the degree of anisotropy $\gamma_2/\gamma_1$ for electromagnetic radiation incident from $\in_{inc}=\mu_{inc}=\gamma_1$ on the anisotropic multilayer structure of FIG. 7A. This result was obtained using TMM, and the thickness of layers A and B were chosen to be equal ($h_A=h_B=0.5a$) so that the structure discriminates different angles over the same frequency interval and for both polarizations simultaneously. Note that this choice of $h_A=h_B$ does not result in the largest possible fractional gap for either polarization, which actually occurs at the quarter-wave condition, satisfied non-simultaneously for the two different polarizations when $\in_A=\mu_B=(\gamma_1,\gamma_1,\gamma_2\neq\gamma_1)$.

From the contour plot in FIG. 7C, one can observe that the size of the fractional gap increases only slightly with increasing anisotropy $\gamma_2/\gamma_1$ beyond $\gamma_2/\gamma_1 \approx 2$, which can also be seen by inspection of Equation 1 and Equation 2, and noticing that the achievable index contrast "saturates" for large $\gamma_2/\gamma_1$ anisotropy values. Therefore, materials with very large anisotropy do not necessarily lead to much larger bandgap in these structures. This is somewhat contrary to conventional photonic crystals where substantially large index contrast typically lead to substantially larger bandgaps. Note also that the size of the fractional frequency gap also increases with $\theta_{inc}$.

Figure 8A:
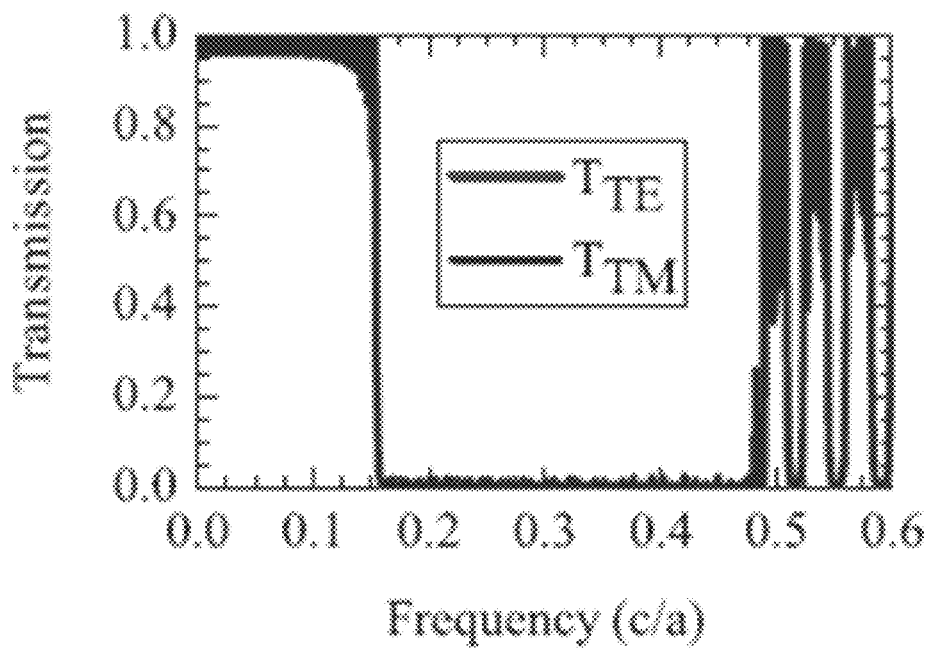
FIGS. 8A-8C are, according to some embodiments, exemplary plots of transmission as a function of frequency.

The structures described above allow one to open an angular gap for both TE and TM polarizations over a certain frequency range. One might also consider how to enlarge the frequency range over which this angular discrimination is exhibited. To achieve a relatively large fractional frequency gap that occurs simultaneously for both polarizations, one can operate at the quarter-wave condition (the structure obeying the quarter-wave condition at 45° is used in the calculations of FIG. 8A, While the structure obeying the quarter-wave condition at 22.5° is used in FIGS. 8B and 8C). In this case, anisotropic $\in_A=\mu_A$ is used (as opposed to the previously considered case when anisotropic $\in_A=\mu_B$). One can start with a single stack consisting of 30 homogeneous bilayers with $\in_A=\mu_A=(1.23, 1.23, 2.43)$ and $\in_B=\mu_B=1.23$. The size of each bilayer in this stack is a. Electromagnetic radiation incident at 45° (from air) on this stack experiences a simultaneous TE and TM photonic bandgap having a fractional frequency width of 6.94% (at quarter-wave condition). To widen this fractional frequency range, one can consider a multilayer consisting of 17 such stacks, each stack being made out of 30 bilayers, however the period of each stack is chosen so that frequency gaps of different stacks are contiguous and merge together, resulting in a much larger frequency gap ($\approx 17$ times the size of the gap in the single gap case). In the system analyzed for this example, the period $a_i$ of the $i^{th}$ stack (i=1, 2, ..., 17) was chosen to be $a_i=1.0694^{(i-1)}a$, where a is the period of the first stack facing the incident electromagnetic radiation. The thickness $h_A^i$ of layer A in the $i^{th}$ stack was chosen to be $0.473a_i$ so that the quarter-wave condition (which maximizes the relative size of the frequency gap) is satisfied. FIG. 8A includes a transmission spectrum, obtained using TMM, for electromagnetic radiation incident from air at an angle of incidence of 45° (i.e., 45° from normal) on the 17-stack multilayer structure described above. As shown in FIG. 8A, a reflection window with a relative frequency size of about 104% was observed for both TE and TM polarizations simultaneously.

Figure 8B:
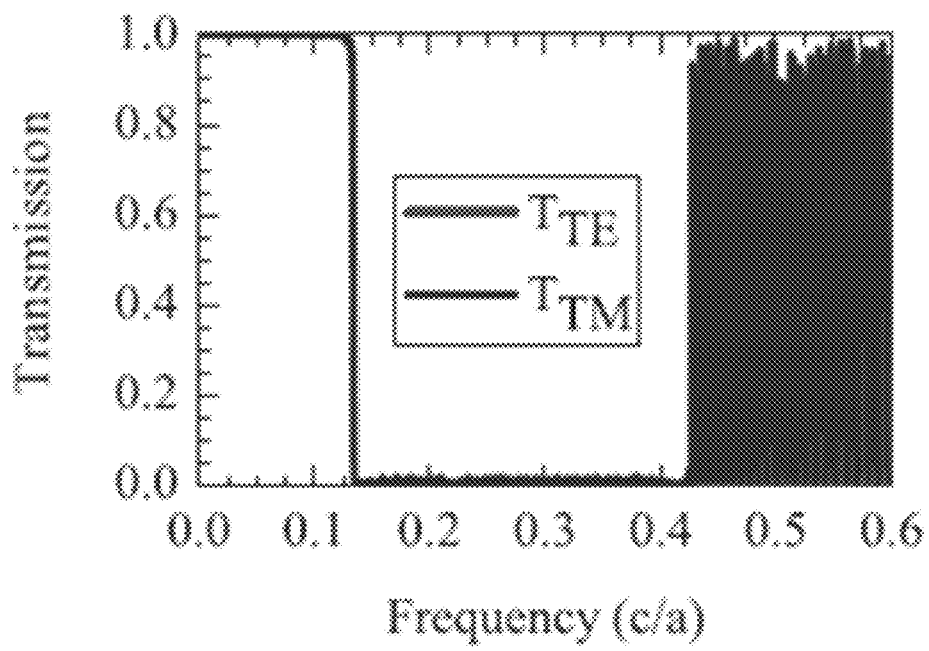

FIG. 8B includes additional transmission spectra obtained using TMM. The TMM results in FIG. 8B show a 107% wide frequency gap for both TE-polarized and TM-polarized electromagnetic radiation incident at 22.5° from the normal, irrespective of its polarization. This structure analyzed in FIG. 8B includes 71 stacks each consisting of 130 bilayers each having $\in_A=\mu_A=(1.23, 1.23, 2.43)$, $\in_B=\mu_B=1.23$, and $a_i=1.0164^{(i-1)}a$. The thickness $h_A^i$ of layer A was $0.494a_i$ in this case (which satisfies the quarter-wave condition).

Figure 8C:
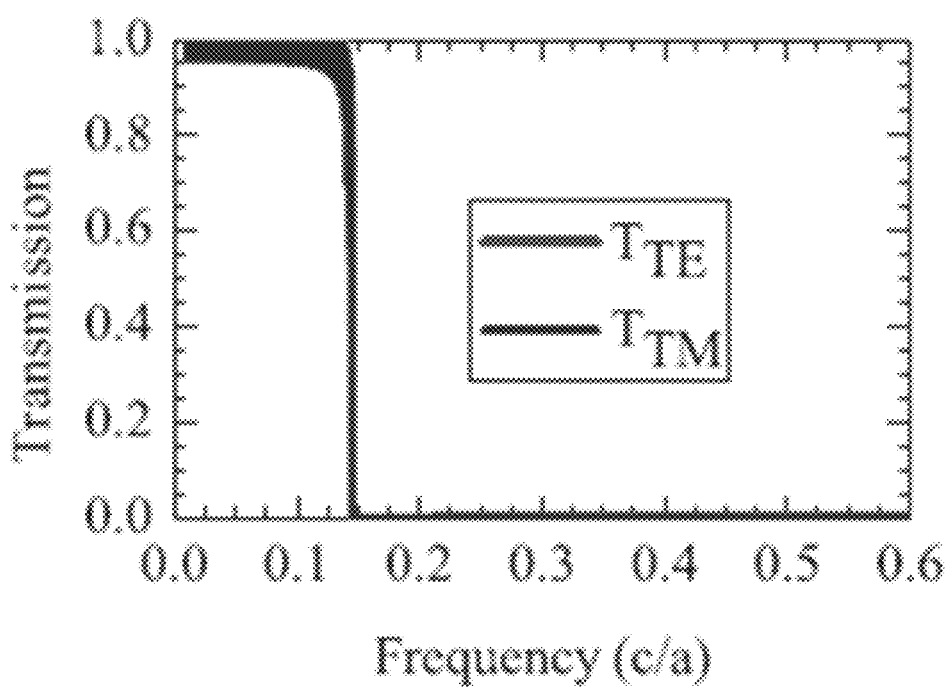

FIG. 8C includes TMM transmission spectra for electromagnetic radiation incident at 45° on the structure described in association with FIG. 8B. In the case illustrated in FIG. 8C, there is reflection at all frequencies that fall inside the reflection window shown in FIG. 8B for 22.5° incidence. That is, the structure designed to reflect 22.5°-incident electromagnetic radiation in the frequency range (0.13c/a→0.43c/a) irrespective of its polarization, is also capable of reflecting electromagnetic radiation incident at all angles greater than 22.5° in this same frequency range and irrespective of the polarization; after all, bandgap of each stack is larger for 45° incidence than for 22.5° incidence. Electromagnetic radiation incident close-to-normal on this same structure is transmitted irrespective of its polarization. In fact, this proposed structure exhibits an angular gap (for $\theta_{inc}$ between 22.5° and 90°) for both polarizations simultaneously over a 107% wide frequency range.

A variety of materials can be used to achieve the above-described concepts. As seen in FIG. 6A, dielectric metamaterial approaches could be used for TM-polarized electromagnetic radiation. For TE polarization (where anisotropic p can be used), one option is to use metallo-dielectric metamaterials as described, for example, in J. B. Pendry, A. J. Holden, D. J. Roddins, and W. J. Stewart, IEEE transactions on microwave theory and techniques, Vol. 47, No. 11, November 1999. In some cases, one might split incoming electromagnetic radiation according to polarization before it enters the structure, rotate TE polarization into TM polarization, and only then allow it to continue to the structure (see e.g., Barwicz, M. R. Watts, M. A. Popovic, P. T. Rakich, L. Socci, F. X. Kaertner, E. P. Ippen, and H. I. Smith, *Nature Photonics,* 1, pp 57-60, (2007)).

Example 2

Figure 9A:
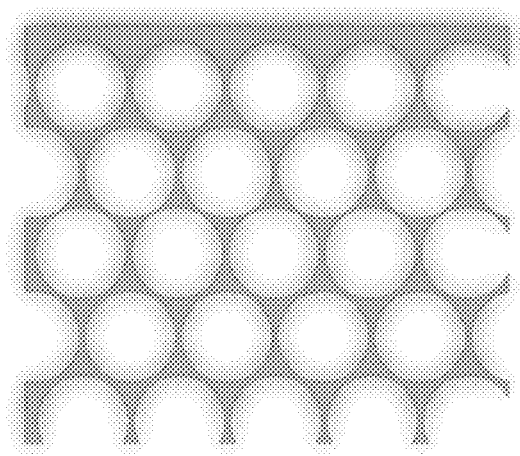
FIGS. 9A-9F are exemplary schematic diagrams of a macroscale transmitter, according to some embodiments.
Figure 9B:
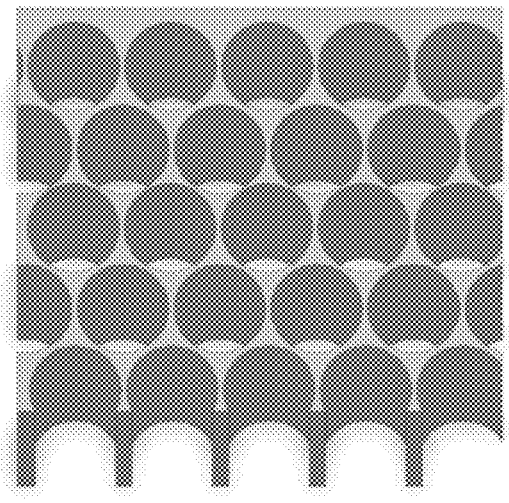
Figure 9C:
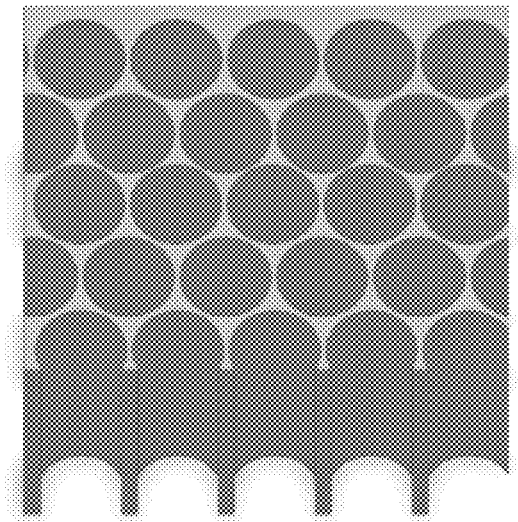
Figure 9D:
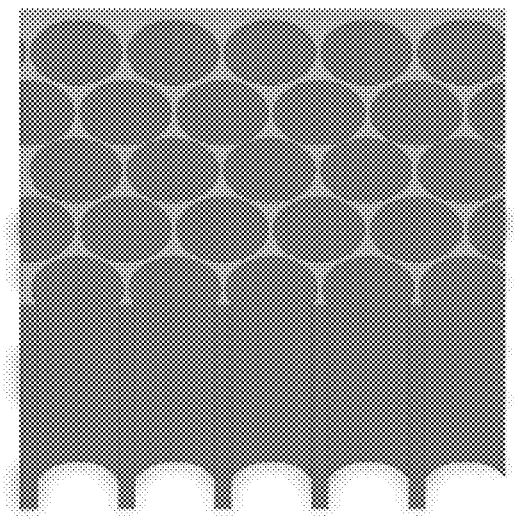
Figure 9E:
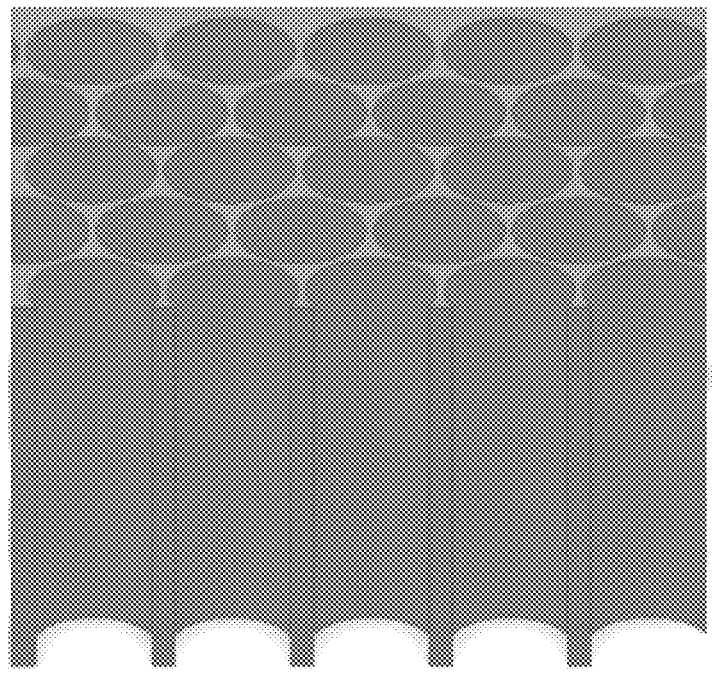
Figure 9F:
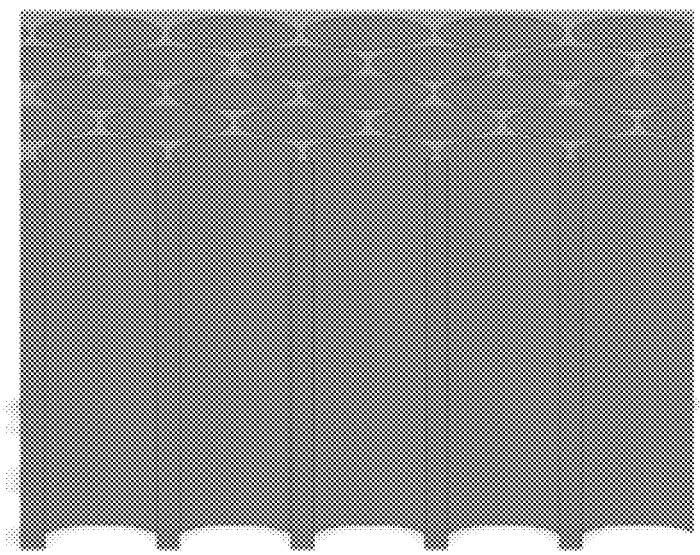

This example describes the design and performance of a macroscale filter used to discriminate electromagnetic radiation based on angle of incidence. In this example, a 2-dimensional array of channels is formed in a reflective material to produce the structure illustrated in FIGS. 9A-9F. FIG. 9A is a schematic illustration of the incident surface of the structure (i.e., a top view of the structure). FIGS. 9B-9F are schematic illustrations of the structure in FIG. 9A from various incidence angles. FIG. 9B is a view of the structure from an incidence angle of 15°, FIG. 9C is a view from an incidence angle of 30°, FIG. 9D is a view from an incidence angle of 45°, FIG. 9E is a view from an incidence angle of 60°, and FIG. 9F is a view from an incidence angle of 75°.

The macroscale filter illustrated in FIGS. 9A-9F includes a periodic array of cylinders formed in a reflective material such as a metal. Each of the holes has a cross-sectional diameter and a length (corresponding to the thickness of the reflective material) such that the aspect ratios of the cylinders are 10:1 (i.e., the channel lengths are 10 times greater than the channel cross-sectional diameters). The holes are spaced such that they have a nearest neighbor distance of 1.05 times the cross-sectional diameters of the holes (i.e., the hole cross-sectional diameters are 95% of the nearest neighbor distances).

The amount of incident electromagnetic radiation that is reflected from the device illustrated in FIGS. 9A-9F is dependent upon the angle of incidence. For angles of incidence less than or equal to $\theta_m$ (which corresponds to the maximum polar angle at which electromagnetic radiation is exchanged with the environment), the percentage of electromagnetic radiation that will be reflected from the macroscale filter is calculated as:

$$\% \text{ Reflected} = R_o + a \cdot \sin(\theta) \quad [5]$$

where $R_o$ represents reflection at normal incidence, a represents angular sensitivity (which depends on the geometry), and $\theta$ is the angle of incidence. For angles of incidence greater than $\theta_m$, the percentage of electromagnetic radiation that will be reflected from the macroscale filter is calculated as:

$$\% \text{ Reflected} = R_o + a \cdot \sin(\theta_m) \quad [6]$$

For the macroscale filter illustrated in FIGS. 9A-9F, at an angle of incidence of 0°, about 16% of the electromagnetic radiation incident on the incident surface is reflected by the filter. At an incidence angle of 75°, roughly 90% of the electromagnetic radiation incident on the incident surface is reflected by the filter.

Example 3

This example describes the enhancement in the performance in a solar thermophotovoltaic (TPV) system that can be achieved using a 2-dimensionally periodic photonic crystal to selectively absorb electromagnetic radiation. In this example, the theoretical performance of a standard solar TPV system without an angularly selective absorber is analyzed, both in the ideal case and with a realistic amount of long-wavelength emissivity. Next, the improvement that can be achieved in a structure with long-wavelength emissivity using an angle-sensitive design, as illustrated in FIG. 10, is described.

Figure 10:
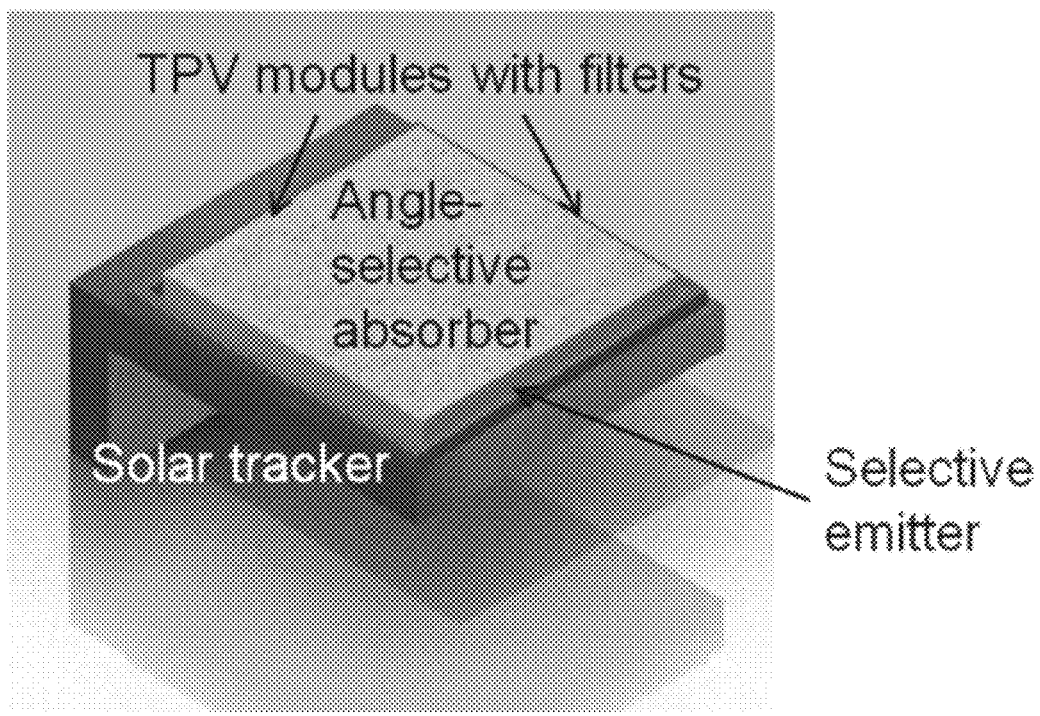
FIG. 10 is an exemplary schematic illustration of a thermophotovoltaic system, according to one set of embodiments.

The energy conversion efficiency of a solar TPV system such as the system illustrated in FIG. 10 is defined to be:

$$\eta = \frac{I_m V_m}{C I_s A_s} \quad [7]$$

where $I_m$ and $V_m$ are the current and voltage of the thermophotovoltaic diode at the maximum power point, C is the concentration in suns relative to the solar constant $I_s$ (usually taken to be 1 kW/m²), and $A_s$ is the surface area of the selective solar absorber. This system can conceptually be decomposed into two halves: the selective solar absorber front end and the selective emitter plus TPV diode back end. Each half can be assigned its own efficiency: $\eta_t$ and $\eta_p$, respectively. The system efficiency can then be rewritten as:

$$\eta = \eta_t(T) \eta_p(T) \quad [8]$$

where T is the equilibrium temperature of the selective absorber and emitter region. The efficiency of each subsystem can be further decomposed into its component parts. In particular, the selective solar absorber efficiency can be represented by:

$$\eta_t(T) = B\bar{\alpha} - \frac{\bar{\epsilon}\sigma T^4}{C I_s} \quad [9]$$

where B is the window transmissivity, $\bar{\alpha}$ is the spectrally averaged absorptivity, $\bar{\epsilon}$ is the spectrally averaged emissivity, and B is the Stefan-Boltzmann constant.

The TPV diode backend efficiency can be represented by $$\eta_p = \frac{I_m V_m}{\bar{\epsilon}_E A_E \sigma T^4} \quad [10]$$

where $\bar{\epsilon}_E$, E and $A_E$ are the effective emissivity and area of the selective emitter, respectively.

Figure 11A:
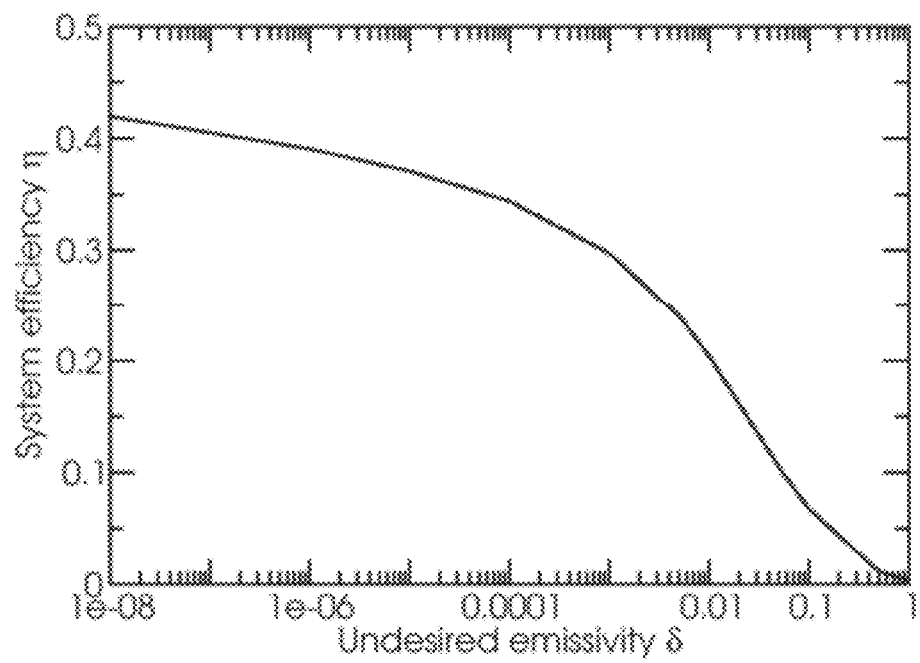
FIGS. 11A-11B are, according to some embodiments, exemplary plots of (A) system efficiency and (B) area ratio as a function of undesired emissivity.
Figure 11B:
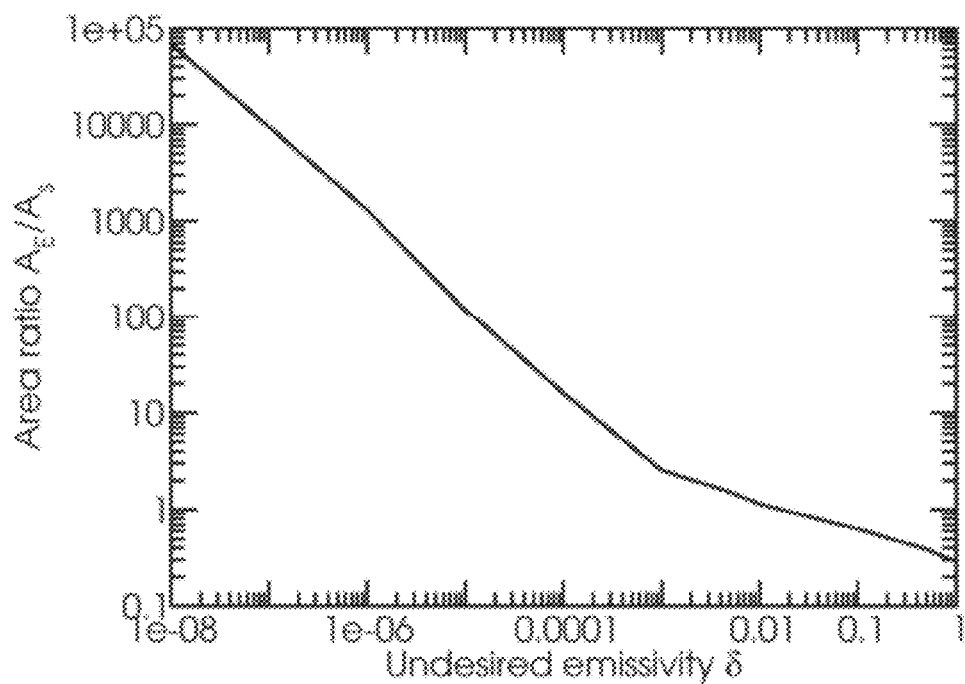

First, one can consider the situation where absorptivity for both the selective absorber and emitter is unity within a certain frequency range, and $\delta$ otherwise. $\delta$ corresponds to the emissivity which cannot be suppressed due to fabrication and/or material constraints, which one would generally like to be as small as possible. The ranges for the selective absorbers and emitters are optimized separately, and the lower end of the selective emitter frequency range equals the TPV diode bandgap frequency $w_g$. If one considers the case of unconcentrated sunlight, the limit $\delta \to 0$ implies a decoupling between the selective absorber and emitter, where the selective absorber is kept relatively cool to maximize $\eta_t$, while the selective emitter acts as if it were much hotter with a bandgap frequency $\omega_g$ well over the blackbody peak predicted by Wien's law. However, this also leads to declining effective emissivity $\bar{\epsilon}_E$, (which varies proportionally with $\delta$), and thus $A_E/A_s$ varies proportionally with $1/\delta$. This expectation is supported by the numerical calculations shown in FIGS. 11A-11B, which demonstrate both that efficiency slowly increases with decreasing δ, while the area ratio increases rapidly as 1/δ. The limit where δ→0 and $A_E/A_s$→∞ is unphysical, both because the time to establish equilibrium in an arbitrarily large system is arbitrarily long, and a perfectly sharp emissivity cutoff requires a step function in the imaginary part of the dielectric constant of the underlying material. However, the latter is inconsistent with the Kramers-Kronig relations for materials, which derive from causality.

Figure 12A:
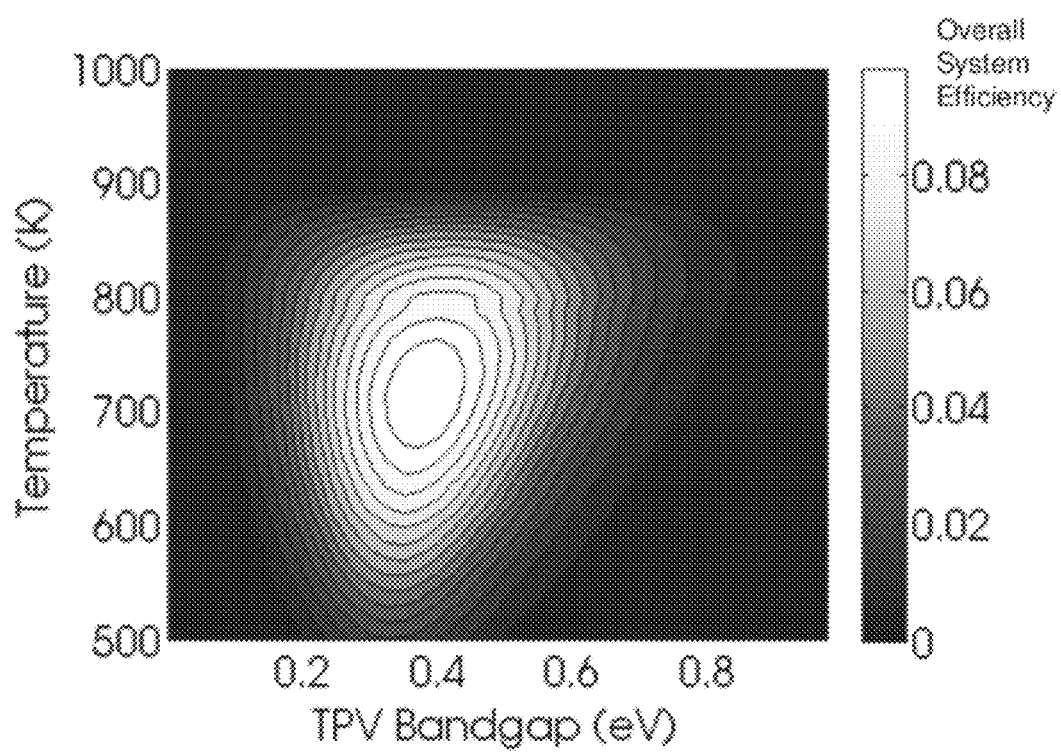
FIGS. 12A-12B are exemplary contour plots of overall system efficiency as a function of temperature and TPV bandgap, according to some embodiments.

Based on previous comprehensive reviews of selective solar absorbers, typical spectrally averaged selective solar absorber emissivities $\overline{\in}$ are about 0.05 at a temperature of approximately 373 K. Assuming δ=0.05 as well, this implies a maximum system efficiency of 10.5% (T=720 K, $\eta_t$=0.6937, $\eta_p$=0.1510, and $A_E$=$A_s$=0.75), as illustrated in FIG. 12A. While a physically relevant result, this efficiency is unfortunately less than a quarter of the asymptotic efficiency calculated above as δ→0.

Figure 12B:
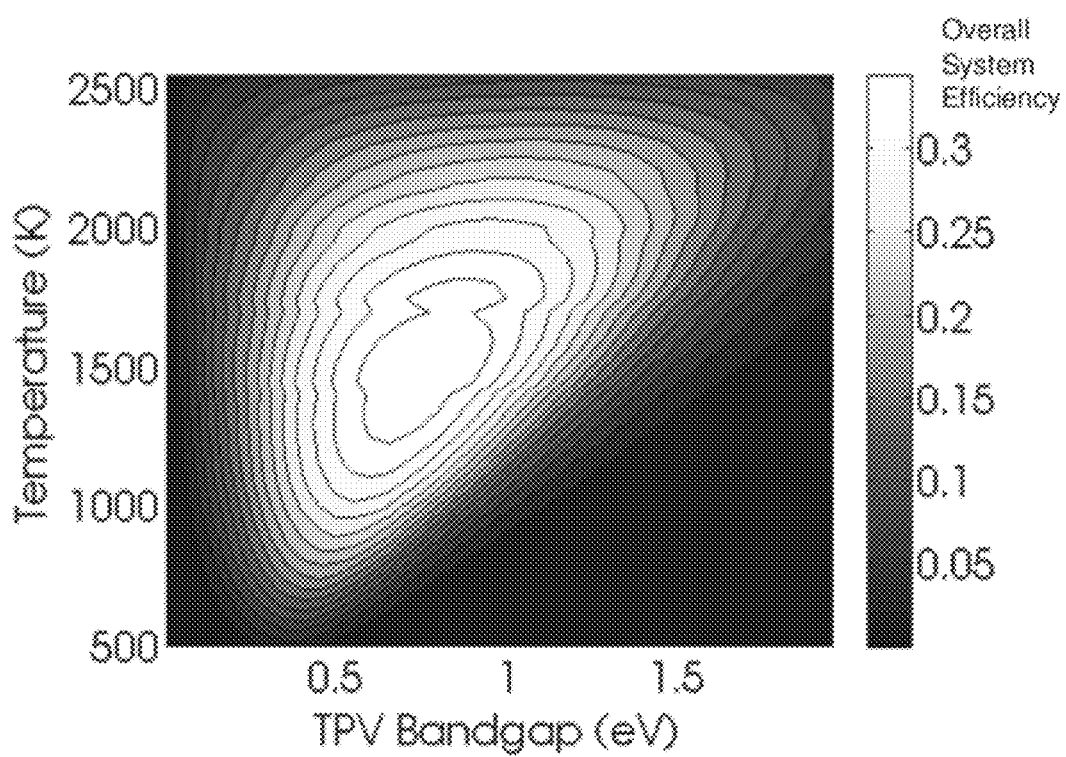
Figure 13:
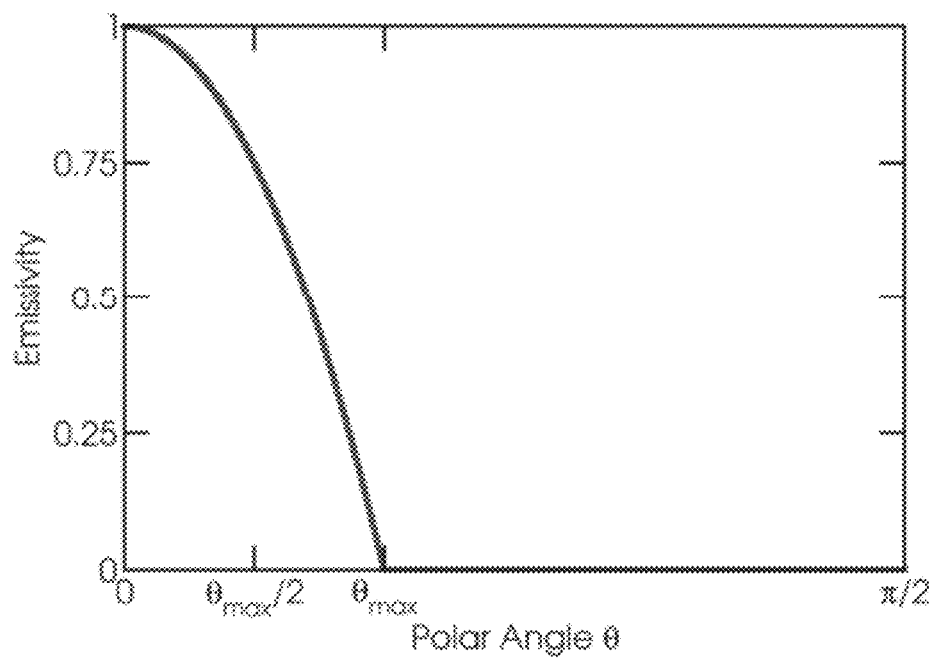
FIG. 13 is an exemplary plot of emissivity as a function of polar angle, according to some embodiments.
Figure 14:
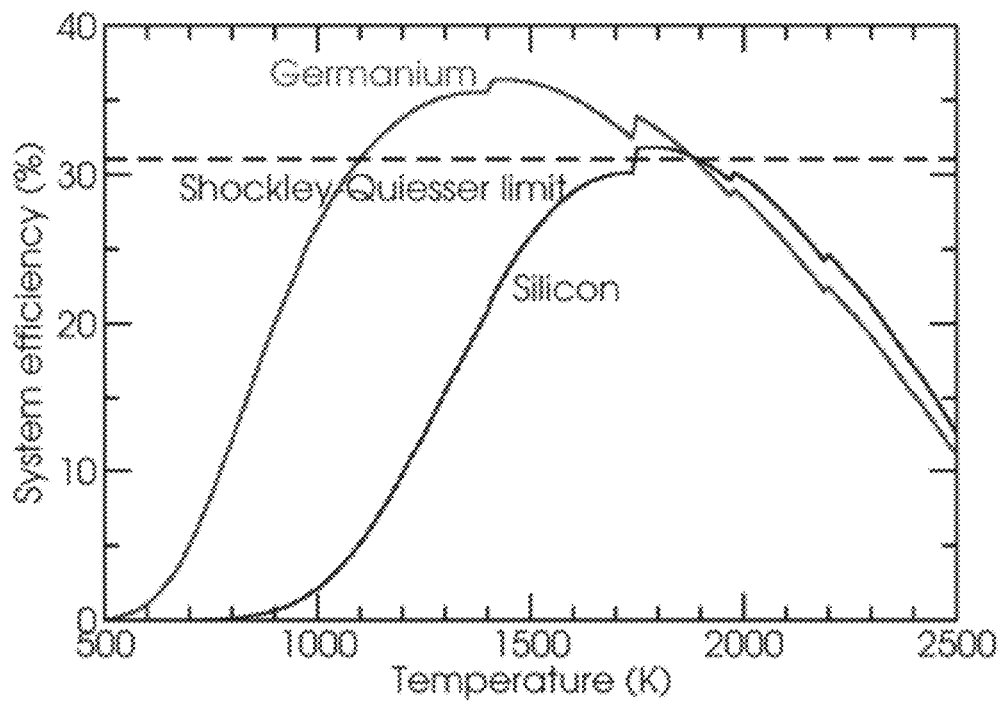
FIG. 14 is an exemplary plot of system efficiency as a function of temperature.

In order to bridge the gap between performance of solar TPV in the cases where δ=0.05 and δ→0, one can employ an absorber with a specific form of angular selectivity. The expression used in this example is as follows:

$$\in(\omega,\theta)=[1-(\theta/\theta_{max}^2)][\delta+(1-\delta)\Pi_{\omega 1,\omega 2}(\omega)] \qquad [11]$$

where $\Pi_{\omega 1,\omega 2}$ is the tophat function (equal to 1 if $\omega_1 < \omega < \omega_2$ and 0 otherwise), $\theta_{max}$ is the maximum polar angle at which electromagnetic radiation is exchanged with the environment, and $\omega_1$ and $\omega_2$ are the range of absorbed wavelengths. FIG. 13 includes a plot of emissivity as a function of polar angle θ for frequencies within the window of the top hat. Inserting Equation 11 into Equation 10 and setting δ=0.05 yields the results in FIG. 12B, where the maximum efficiency is 37.0% (T=1600 K, $\eta_t$=0.7872, $\eta_p$=0.4697, $A_E/A_s$=0.05). This is 3.5 times higher than the result illustrated in FIG. 12A, and is fairly close to the asymptotic limit where δ→0, without the physically unreasonable requirement of a perfectly sharp emissivity cutoff (which is inconsistent with causality). This result also exceeds the Shockley-Quiesser limit for photovoltaic energy conversion in unconcentrated sunlight of 31% efficiency. Furthermore, as illustrated in FIG. 14, photovoltaic diodes made from group IV compounds such as silicon and germanium have bandgaps that would allow for the system to continue to exceed the Shockley-Quiesser limit. Finally, the much lower area ratio $A_E/A_s$=0.05 implies that the angle-selective solar absorber illustrated in FIG. 10 would serve as a sort of thermal concentrator, thus allowing for much less thermophotovoltaic area to be used compared to previous designs.

One structure capable of providing the top-hat functionality described above is a 2-dimensionally periodic photonic crystal configured to selectively absorb incident electromagnetic radiation. The 2-dimensionally periodic photonic crystal considered in this example is formed in a 4244 nm-thick layer of single-crystal tungsten. The tungsten layer comprises a plurality of cylindrical holes with a radius of 795 nm (corresponding to cross-sectional diameters of 1590 nm) formed within the layer. The holes have an average nearest neighbor distance of 1591 nm, and are arranged periodically similar to the arrangement illustrated in FIG. 4A. The cylindrical holes have lengths of 4244 nm, corresponding to the thickness of the tungsten layer in which they were formed.

Figure 15:
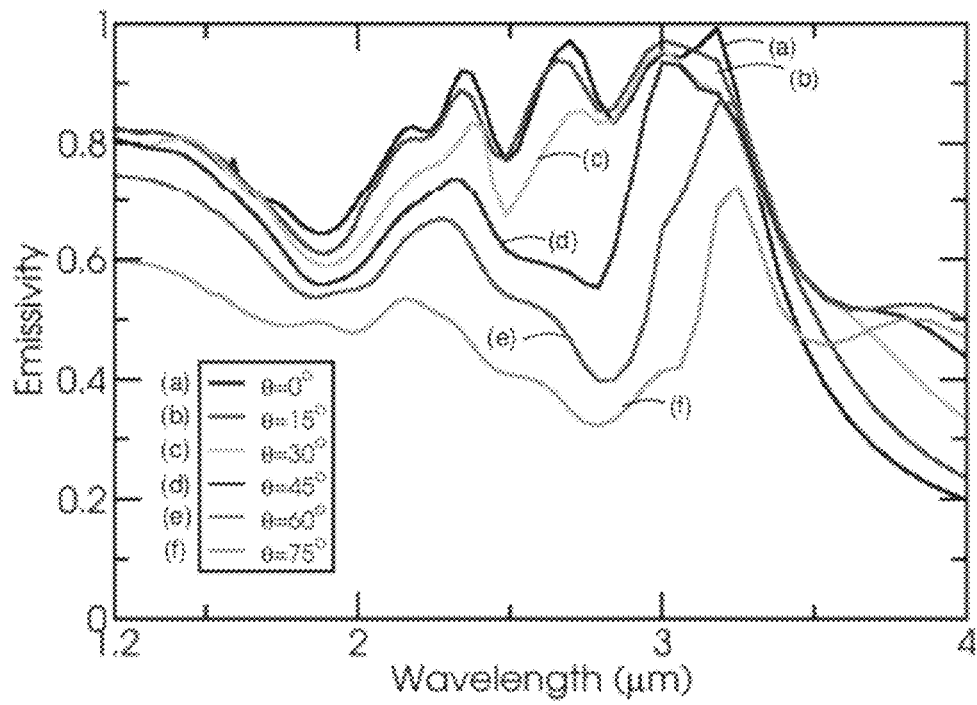
FIG. 15 is an exemplary plot of emissivity as a function of wavelength.

The performance of the 2-dimensionally periodic photonic crystal described above was simulated using S-matrix code as described in Whittaker and Culshaw, "Scattering-matrix treatment of patterned multilayer photonic structures," *Phys Rev B*, 60, 2610 (1999). As shown in FIG. 15, the 2-dimensionally periodic photonic crystal exhibits decreasing average emissivity with increasing incident angle. In particular, at a 75° incident angle, the average emissivity is 60% lower than at normal incidence (i.e., an incident angle of 0°).

While several embodiments of the present invention have been described and illustrated herein, those of ordinary skill in the art will readily envision a variety of other means and/or structures for performing the functions and/or obtaining the results and/or one or more of the advantages described herein, and each of such variations and/or modifications is deemed to be within the scope of the present invention. More generally, those skilled in the art will readily appreciate that all parameters, dimensions, materials, and configurations described herein are meant to be exemplary and that the actual parameters, dimensions, materials, and/or configurations will depend upon the specific application or applications for which the teachings of the present invention is/are used. Those skilled in the art will recognize, or be able to ascertain using no more than routine experimentation, many equivalents to the specific embodiments of the invention described herein. It is, therefore, to be understood that the foregoing embodiments are presented by way of example only and that, within the scope of the appended claims and equivalents thereto, the invention may be practiced otherwise than as specifically described and claimed. The present invention is directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the scope of the present invention.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

What is claimed is:

1. An article, comprising:
a photonic material comprising a plurality of periodically occurring separate layers, including at least a first layer and a second layer disposed over the first layer, wherein:
the first or second layer has an isotropic dielectric function while the other of the first and second layers has an anisotropic dielectric function;
the first or second layer has an isotropic magnetic permeability while the other of the first and second layers has an anisotropic magnetic permeability; and
the first and second layers are part of a 1-dimensionally periodic photonic crystal comprising a periodic assembly of layers, wherein the 1-dimensionally periodic photonic crystal is arranged in such a way that a line along a first coordinate direction within the 1-dimensionally periodic photonic crystal passes through multiple layers while lines along second and third orthogonal coordinate directions, each of the second and third orthogonal coordinate directions being orthogonal to the first coordinate direction within the 1-dimensionally periodic photonic crystal, do not pass through multiple layers.

2. The article of claim 1, wherein the first layer has an isotropic dielectric function, and the second layer has an anisotropic dielectric function.

3. The article of claim 1, wherein the first layer has an anisotropic dielectric function, and the second layer has an isotropic dielectric function.

4. The article of claim 1, wherein the first layer has an isotropic magnetic permeability, and the second layer has an anisotropic magnetic permeability.

5. The article of claim 1, wherein the first layer has an anisotropic magnetic permeability, and the second layer has an isotropic magnetic permeability.

6. The article of claim 2, wherein the second layer comprising an anisotropic dielectric function comprises a material having an anisotropic dielectric function.

7. The article of claim 6, wherein the material having an anisotropic dielectric function comprises $TiO_2$, calcite, calomel, beryl, lithium niobate, zircon, and/or mica.

8. The article of claim 2, wherein the second layer comprising an anisotropic dielectric function comprises a combination of at least two materials arranged to have an anisotropic effective dielectric function.

9. The article of claim 8, wherein the combination of at least two materials arranged to have an anisotropic effective dielectric function form a 2-dimensionally periodic photonic crystal.

10. The article of claim 4, wherein the second layer comprising an anisotropic magnetic permeability comprises a combination of at least two materials arranged to have an anisotropic effective magnetic permeability.

11. The article of claim 10, wherein the second layer comprising an anisotropic magnetic permeability comprises a combination of a metal and a second material.

12. The article of claim 11, wherein the second material comprises a dielectric material.

13. The article of claim 10, wherein the combination of at least two materials arranged to have an anisotropic effective magnetic permeability form a 2-dimensionally periodic photonic crystal.

14. The article of claim 1, wherein, when the photonic material is exposed to electromagnetic radiation, at least about 75% of the electromagnetic radiation within a range of wavelengths that contacts an incident surface of the photonic material within a range of angles of incidence is transmitted through the photonic material, and at least about 75% of the electromagnetic radiation within the range of wavelengths that contacts the incident surface outside the range of angles of incidence is reflected by the photonic material.

15. The article of claim 1, further comprising an energy conversion device configured to produce electricity from electromagnetic radiation received from the photonic material.

16. The article of claim 15, wherein the energy conversion device comprises a photovoltaic cell.

17. The article of claim 16, wherein the photovoltaic cell comprises a solar photovoltaic cell.

18. The article of claim 16, wherein the photovoltaic cell is a thermophotovoltaic cell.

19. The article of claim 16, wherein the energy conversion device comprises a heat engine.

20. The article of claim 1, wherein the 1-dimensionally periodic photonic crystal is configured to selectively transmit electromagnetic radiation based upon the angle of incidence of the electromagnetic radiation.

* * * * *